US006795346B2

United States Patent
Otani et al.

(10) Patent No.: US 6,795,346 B2
(45) Date of Patent: Sep. 21, 2004

(54) NON VOLATILE MEMORY AND DATA PROCESSOR

(75) Inventors: Hidenari Otani, Hitachinaka (JP); Kunihiko Suzuki, Hitachinaka (JP); Shouji Satou, Ibaraki (JP)

(73) Assignee: Renesas Technology Corp., Tokyo (JP)

( * ) Notice: Subject to any disclaimer, the term of this patent is extended or adjusted under 35 U.S.C. 154(b) by 40 days.

(21) Appl. No.: 10/345,945

(22) Filed: Jan. 17, 2003

(65) Prior Publication Data

US 2003/0109096 A1 Jun. 12, 2003

Related U.S. Application Data

(62) Division of application No. 10/278,896, filed on Oct. 24, 2002.

(30) Foreign Application Priority Data

Nov. 20, 2001 (JP) ........................................ 2001-354265

(51) Int. Cl.[7] .............................................. G11C 16/04
(52) U.S. Cl. ............................. 365/185.24; 365/185.13; 365/185.18
(58) Field of Search ........................... 365/203, 185.13, 365/185.24, 185.18

(56) References Cited

U.S. PATENT DOCUMENTS

| | | | | |
|---|---|---|---|---|
| 5,781,469 A | 7/1998 | Pathak et al. ............... | 365/156 |
| 6,028,813 A | 2/2000 | Choi ..................... | 365/230.04 |
| 6,088,265 A | * | 7/2000 | Ohta ..................... | 365/185.16 |
| 6,154,412 A | 11/2000 | Ishikawa et al. ............ | 365/226 |
| 6,215,699 B1 | * | 4/2001 | Yamamoto ............. | 365/185.09 |
| 6,584,034 B1 | 6/2003 | Hsu et al. ............... | 365/230.05 |
| 6,621,744 B2 | * | 9/2003 | Kojima .................. | 365/185.23 |
| 6,628,563 B1 | * | 9/2003 | Hsu et al. ............... | 365/230.03 |

* cited by examiner

*Primary Examiner*—Son Mai
(74) *Attorney, Agent, or Firm*—Miles & Stockbridge P.C.

(57) ABSTRACT

The present invention aims to shorten the time required to charge and discharge a bit line connected with each of non-volatile memory cells and speed up the reading of memory information from the non-volatile memory cell. With a main/sub bit line structure as a premise, a clamp voltage is supplied from each of voltage supply elements (QPC0 through QPCm) to each of main bit lines (MB0 through MBm) during a period prior to and subsequent to a read operation for a non-volatile memory cell (MC). In parallel with it, sub bit lines (LB00 through LBkm) are respectively discharged by discharge elements (QD00 through QDkm). There is no need to precharge the main bit line from a ground level upon the operation of reading memory information and a read operation time can hence be shortened. Thus, a non-volatile memory becomes fast in operating speed. Since the drain (sub bit line) of the memory cell is maintained at a ground potential, no memory disturb problem arises.

3 Claims, 22 Drawing Sheets

FIG. 8

| | PRECHARGE TIME | DISCHARGE TIME | PRECHARGE AND DISCHARGE |
|---|---|---|---|
| COMPARATIVE EXAMPLE | TIME REQUIRED TO RAISE VOLTAGE UP TO GROUND~PRECHARGE VOLTAGE | TIME REQUIRED TO DROP TO VOLTAGES V1, V2 AT READ COMPLETION~GROUND VOLTAGE | PERFORM PRECHARGE BEFORE READING OF MEMORY PERFORM DISCHARGE UPON READ COMPLETION |
| PRESENT INVENTION | TIME REQUIRED TO SET TO VOLTAGES V3, V4 AT READ COMPLETION~GROUND VOLTAGE | TIME REQUIRED TO DROP TO VOLTAGES V3, V4 AT READ COMPLETION~GROUND VOLTAGE | SIMULTANEOUSLY PERFORM PRECHARGE AND DISCHARGE AFTER READING OF MEMORY |

NON VOLATILE MEMORY AND DATA PROCESSOR

CROSS-REFERENCE TO RELATED APPLICATION

This application is a divisional of application Ser. No. 10/278,896 filed Oct. 24, 2002.

BACKGROUND OF THE INVENTION

The present invention relates to a semiconductor device having an electrically programmable non-volatile memory, and a data processor. The present invention also relates to a technology for solving a delay in read access due to pre-charge and discharge operations of each bit line, which are necessary for the operation of reading memory information held in each non-volatile memory cells of the non-volatile memory, e.g., a technology effective for application to a microcomputer equipped with a flash memory in an on-chip form.

A flash memory, which is one electrically writable or programmable memory, has non-volatile memory cells each comprising one memory cell transistor having a floating gate, a control gate, a source and a drain, for example. In the memory cell transistor, a threshold voltage thereof rises when electrons are injected into the floating gate, whereas when the electrons are extracted from the floating gate, its threshold voltage drops. The memory cell transistor serves so as to store information corresponding to the magnitude or high and low levels of a threshold voltage relative to a word line voltage (voltage applied to control gate) for reading data. Although not restricted in particular, the state in which the threshold voltage of the memory cell transistor is low, is called an "erase state", and the state in which the threshold voltage thereof is high, is called a "write state".

In order to read information held in each of the non-volatile memory cells, the drain side (bit line side) of the selected non-volatile memory cell is clamped to a precharge voltage and a gate voltage is applied. If the electrons have been stored in the non-volatile memory cell, the threshold voltage is high and no current flows even if the gate voltage is applied. If no electrons are stored in the memory cell, the threshold voltage is low and the current flows when the gate voltage is applied.

A sense amplifier detects such a state. Now consider where the sense amplifier is of a current sense type sense amplifier, for example. When the sense amplifier causes a current equivalent to half of a memory cell current (corresponding to a current flowing in each memory cell held on) to flow, a bit line voltage of a memory cell high in threshold voltage becomes higher than a precharge voltage. A bit line voltage of a memory cell low in threshold voltage becomes lower than the precharge voltage. A logic value of memory information held in the corresponding memory cell is judged according to the difference between the above voltages. Even when the sense amplifier belongs to a non-current sense type configuration, e.g., it is of a differential sense amplifier of such a type that a bit line voltage is compared with a reference level, there is a need to precharge the corresponding bit line to the reference level or a level close to it in advance before the start of a read operation. In order to read the information of the memory cell in this way, there is a need to clamp the corresponding bit line to the precharge voltage.

On the other hand, let's look at the memory cell. If the voltage is always applied to the source side (source line side) or drain side (bit line side), such an electric field that electrons are stored in or extracted or drawn from the floating gate, is formed, thus causing a possibility that memory information will be damaged (disturbed). It is not desirable that the voltage like the precharge voltage is always applied to the drain of each memory cell via its corresponding bit line in order to prevent the fear of such disturb before happens.

Therefore, there is a need to set the source and drain sides of the memory cell as a ground potential when no reading is done. The bit line must be discharged because the precharge voltage is clamped before the reading and the voltages on the source and drain sides are set to the ground potential rapidly after the reading. In order to reduce capacitance parasitic on each bit line connected with the drain of the memory cell in particular, a main/sub bit line structure is frequently adopted. In the main/sub bit line structure, only a sub bit line connected with a memory cell intended for a read operation is connected to its corresponding main bit line.

SUMMARY OF THE INVENTION

However, in order to read memory information of a non-volatile memory cell, there is a need to carry out pre-reading bit line precharge and post-reading bit line discharge. Even if the operating time (corresponding to the time required to make a decision as to whether a main bit line voltage is larger or smaller than a precharge voltage) necessary to read memory information could be shortened owing to the configuration or the like of the sense amplifier, the shortening of the time intervals for the precharge and discharge have been not yet implemented. With the trend toward an increase in parasitic capacitive component due to an increase in storage capacity, the precharge and discharge time intervals become long in reverse.

An object of the present invention is to shorten the time necessary to charge and discharge a bit line to which a non-volatile memory cell is connected.

Another object of the present invention is to speed up the reading of memory information from a non-volatile memory cell without performing an improvement in the performance of a sense amplifier, etc.

A further object of the present invention is to provide a data processor capable of contributing to the speeding up of data processing in terms of the reading of memory information from a non-volatile memory cell at high speed.

The above, other objects and novel features of the present invention will become apparent from the description of the present specification and the accompanying drawings.

Summaries of typical ones of the inventions disclosed in the present application will be described in brief as follows:

A semiconductor device according to the present invention has an electrically programmable non-volatile memory. The non-volatile memory includes a plurality of non-volatile memory cells (MC), word lines (X00 through Xkn) respectively connected to select terminals of the non-volatile memory cells, sub bit lines (LB00 through LBkm) respectively connected to data terminals of the non-volatile memory cells, main bit lines (MB0 through MBm), sub bit line selection switch elements (Q00 through Qkm) which selectively connect the sub bit lines to the main bit lines, a sense amplifier (30) connected to the main bit lines via column switch elements (QY0 through QYm), and voltage supply elements (QPC0 through QPCm) each of which supplies a predetermined clamp voltage to each of the main bit lines. The clamp voltage is a predetermined level between a high-level side attainment level outputted from the sense amplifier and a low-level side attainment level outputted therefrom. Each of the voltage supply elements supplies the clamp voltage to the corresponding main bit line during at least a period prior to and subsequent to a read operation for each of the non-volatile memory cells.

According to the above means, the clamp voltage is supplied from each of the voltage supply elements to its corresponding main bit line during at least the period prior to and subsequent to the read operation for each non-volatile memory cell. Accordingly, there is no need to precharge the main bit line from the ground level upon the operation of reading the memory information, and the read operating time can hence be shortened. Since the non-volatile memory becomes fast in operating speed, the operating speed or throughput of the whole data processing system using it can be enhanced.

The clamp voltage is a level desirable in terms of a sense operation of the sense amplifier. The clamp voltage is, for example, a criterion level of the sense amplifier or a level higher than the criterion level. A discharge for each sub bit line is not necessary either for a non-volatile memory cell having a device structure free of the occurrence of disturb at that level.

In order to stabilize the operation of sensing by the sense amplifier even with respect to the small amount of a signal read from the memory cell and thereby speed up the determination of the sense operation, the voltage supply element may preferably stop the operation of supply of the clamp voltage during the period of the read operation for the non-volatile memory cell.

In order to previously prevent the fear of disturb, discharge elements (QD00 through QDkm) for respectively discharging the sub bit lines when the sub bit line selection switch elements are respectively held off, may preferably be adopted. That is, the precharge for each main bit line, i.e., the supply of the clamp voltage and the discharge for each sub bit line are performed in parallel. Supplying the clamp voltage to the main bit line so as to avoid mutual interference of such parallel operations may be performed when the sub bit line selection switch element is held off.

In order to shorten a precharge time prior to the reading of memory information with a main/sub bit line structure as a premise from the above, the main bit line is clamped to a precharge voltage in advance, and the drain (sub bit line) of each memory cell is maintained at a ground potential. There is therefore no problem of memory disturb. Since the time required to charge each main bit line becomes predominant, the time necessary for precharge can be shortened by clamping the main bit line to the precharge voltage in advance. While both the main bit and sub bit lines have heretofore been discharged and set as the ground potential after reading, only each sub bit line is intended for discharge. Clamping the main bit line to the precharge voltage simultaneously with its discharge makes it possible to shorten the time necessary for charge and discharge.

Since the above means does not depend on the configuration of the sense amplifier, it is adaptable even if sense amplifiers of any circuit configuration are used. It is not necessary to change the sense amplifier. The non-volatile memory cell may be a memory which stores multi-valued information as well as binary information.

As one aspect of the present invention, clamp voltage supply elements are disposed every main bit lines as an alternative to the conventional provision of the precharge elements every sense amplifiers. As an alternative to the provision of the discharge elements every sense amplifiers, they are also disposed every sub bit lines. In order to reduce the number of the clamp voltage supply elements, the voltage supply elements may be provided for a common data line (CD) commonly connected to the column switch elements. In this case, all the column switch elements sharing the sense amplifier are brought to an on state in a non-selected state of each memory cell to thereby enable clamp operations for the main bit lines. When the corresponding memory cell is selected, only the column switch to be selected is held in an on state and others are respectively set to an off state.

As one aspect of the present invention, the sub bit line selection switches can be switch-controlled separately every main bit lines sharing the common data line commonly connected to the column switch elements. Only the sub bit line selection switch connected to the main bit line selected by the corresponding column switch element is brought to an on state upon a read operation. The sub bit lines connected to the remaining sub bit line selection switches held off are respectively electrically isolated from their corresponding main bit lines, so that an electrical charge on each main bit line is not wastefully transferred to its corresponding sub bit line unsubjected to the read operation. As another aspect thereof, source line connection selection switch elements which selectively connect source lines of a plurality of non-volatile memory cells to a common source line every main bit lines sharing the common data line commonly connected to the column switch elements, are disposed. The source line connection selection switch element connected to the non-volatile memory cell for each main bit line selected by the corresponding column switch element is brought to an on state upon the read operation. It is thus possible to suppress the useless flowing of a charge current on each bit line in the common source line.

As one aspect of the present invention, the sense amplifier is configured as a current sense type circuit which supplies a current smaller than a current flowing in the corresponding non-volatile memory cell held on when selected by each of the word lines, to each bit line and detects a change in bit line level with respect to a criterion level.

A data processor according to the present invention has an electrically programmable non-volatile memory, and a CPU accessible to the non-volatile memory. The non-volatile memory includes a plurality of non-volatile memory cells, word lines respectively connected to select terminals of the non-volatile memory cells, sub bit lines respectively connected to data terminals of the non-volatile memory cells, main bit lines, sub bit line selection switch elements which selectively connect the sub bit lines to the main bit lines, a sense amplifier connected to the main bit lines via column switch elements, voltage supply elements each of which supplies a predetermined clamp voltage to each main bit line, and discharge elements which discharge the sub bit lines. Each of the voltage supply elements supplies the clamp voltage to the corresponding main bit line before the start and completion of a read operation effected on each non-volatile memory cell. The discharge elements discharge the sub bit lines after the completion of the read operation.

In a manner similar to the above, after the read operation, only the sub bit line is intended for discharge and each of the main bit lines is clamped to the precharge voltage simultaneously with its discharge. It is therefore possible to shorten the time required to perform the charge and discharge. Since the drain (sub bit line) of each memory cell is held at the ground potential when the main bit line is clamped to the precharge voltage, a memory disturb problem does not arise and the speeding up of the read operation can be realized.

BRIEF DESCRIPTION OF THE DRAWINGS

FIG. 8 is an explanatory view showing a precharge time, a discharge time and precharge/discharge operations between a comparative example and the present invention;

DEAILED DESCRIPTION OF THE PREFERRED EMBODIMENTS

<<Flash Memory>>

Figure 2:
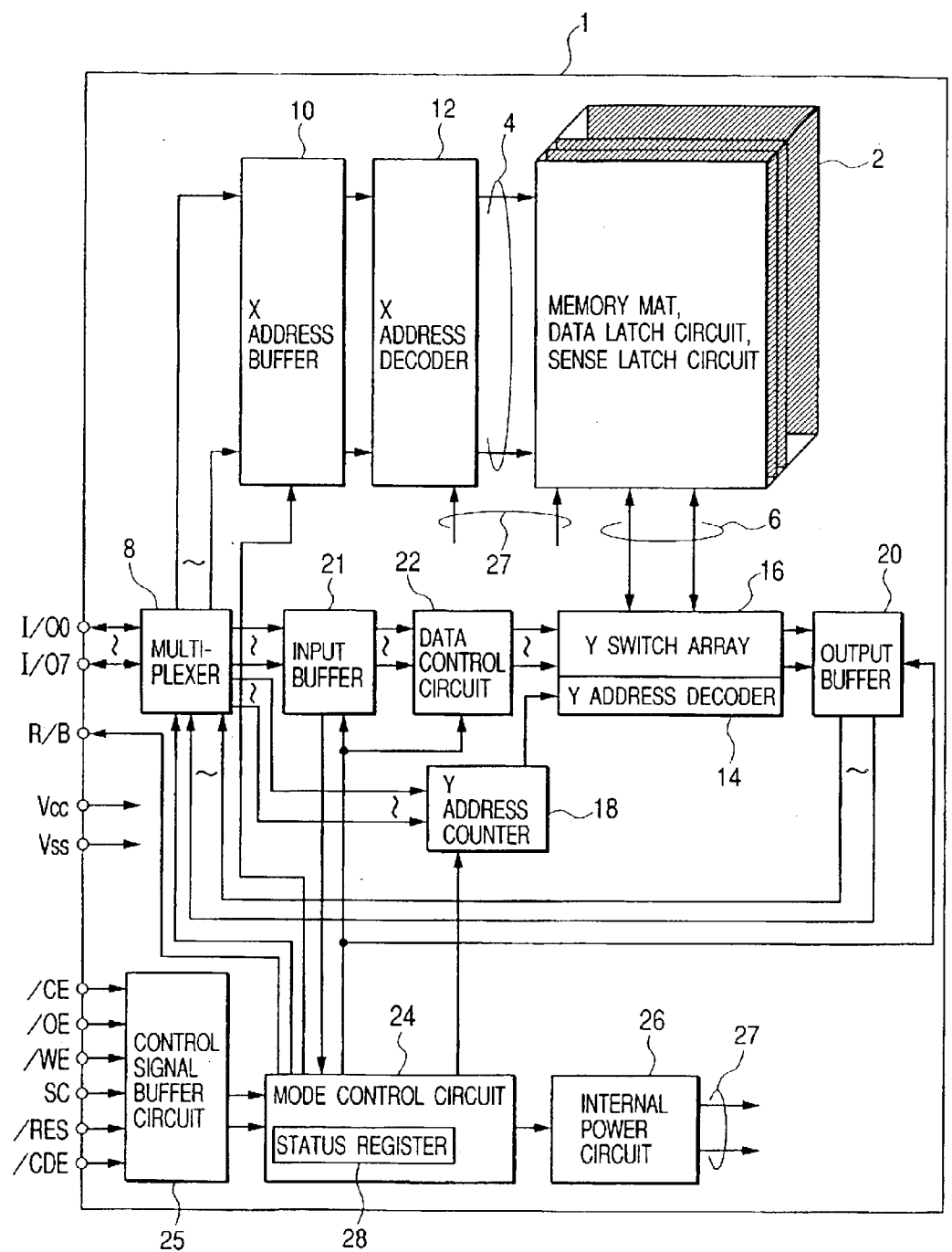
FIG. 2 is a block diagram schematically illustrating the whole of the flash memory according to one embodiment of the present invention.

A schematic configuration of a flash memory 1 illustrative of one embodiment of a semiconductor device according to the present invention is illustrated in FIG. 2 by way of example. In the same drawing, each of memory arrays 2 has a memory mat, a data latch circuit and a sense latch circuit, etc. The memory mat has a large number of electrically erasable and programmable non-volatile memory cell transistors. The memory cell transistor (also described as "flash memory cell") comprises, although not shown in the drawing in particular, a source and drain formed within a semiconductor substrate or a well, a floating gate formed in a channel region between the source and the drain with a tunnel oxide film interposed therebetween, and a control gate laminated on the floating gate with an interlayer insulating film interposed therebetween. The control gate is connected to its corresponding word line 4, the drain is connected to its corresponding bit line 6, and the source is electrically connected to its corresponding unillustrated source line. Although their detailed description is omitted herein, specific structures of the bit line and word line are determined according to the structure of the memory mat. For example, the word line 4 is configured as a main/sub word line structure, whereas the bit line 6 is configured as a main/sub bit line structure.

When electrons are injected into the floating gate of the memory cell transistor, the memory cell transistor rises in threshold voltage. On the other hand, when the electrons are extracted or drawn from the floating gate, the threshold voltage thereof is lowered. The memory cell transistor serves so as to store information corresponding to the magnitude or high and low levels of a threshold voltage relative to a word line voltage (voltage applied to control gate) for reading data. Although not restricted in particular, the state in which the threshold voltage of the memory cell transistor is low, is called an "erase state", and the state in which the threshold voltage thereof is high, is called a "write state". Incidentally, since the definition of writing and erasing is a relative concept, they may be defined contrary to the above.

External input/output terminals I/O0 through I/O7 of the flash memory 1 connected to a bus share the use of address input terminals, data input terminals, data output terminals and command input terminals. X address signals inputted from the external input/output terminals I/O0 through I/O7 are supplied to an X-address buffer 10 via a multiplexer 8. An X-address decoder 12 decodes an internal complementary address signal outputted from the X-address buffer 10 to drive its corresponding word line 4.

Although not restricted in particular, sense latch circuits are provided on the one-end sides of the bit lines 6 respectively, and data latch circuits are provided at their other ends respectively. The corresponding bit line 6 is selected by a Y switch array 16, based on a select signal outputted from a Y-address decoder 14. Y-address signals inputted from the external input/output terminals I/O0 through I/O7 are preset to a Y-address counter 18, after which the address signals incremented sequentially with the preset values as starting points are supplied to the Y-address decoder 14.

The corresponding bit line selected by the Y switch array 16 is made conductive or conducted to an input terminal of an output buffer 20 upon a data output operation. Upon a data input operation, the bit line is caused to conduct into an output terminal of a data control circuit 22 via an input buffer 21. The multiplexer 8 controls electrical connections between the output buffer 20 and the input/output terminals I/O0 through I/O7 and between the input buffer 21 and the input/output terminals I/O0 through I/O7. Commands supplied from the input/output terminals I/O0 through I/O7 are supplied to a mode control circuit 24 through the multiplexer 8 and the input buffer 21.

A control signal buffer circuit 25 is inputted with a chip enable signal /CE, an output enable signal /OE, a write enable signal /WE, a serial clock signal SC, a reset signal /RES and a command enable signal /CDE as access control signals. Symbols/affixed immediately before signal names means that the corresponding signals are low enable. The mode control circuit 24 controls the function of interfacing signals with the outside via the multiplexer 8 according to the states of these signals, etc. The command inputs sent from the input/output terminals I/O0 through I/O7 are synchronized with the command enable /CDE. Each data input is synchronized with the serial clock SC. The input of address information is synchronized with the write enable signal /WE. When the start of an erase or write operation is instructed by a command code, the mode control circuit 24 asserts a ready/busy signal R/B indicative of the erase or write operation being in execution and outputs it to the outside during its instruction period.

An internal power circuit (internal voltage generator) 26 generates operating power supplies 27 set as various internal voltages for write, erase, verify and read, etc. and supplies them to the X-address decoder 12 and the memory cell array 2, etc.

The mode control circuit 24 generally controls the flash memory according to input commands. The operation of the flash memory 1 is basically determined according to commands. As the commands for the flash memory 1, may be mentioned, respective commands for read, erase, write, etc. For instance, the read command includes a read command code, a read X address and a necessary Y address. The write command includes a write command code, an X address, a necessary Y address and write data.

The flash memory 1 has a status register 28 to indicate its internal state. The contents thereof can be read from the input/output terminals I/O0 through I/O7 according to the assertion of the signal /OE.

The erasing of memory information from the flash memory 1 is enabled in block units. The minimum unit of each erase block is set as a flash memory cell group which shares the use of a source line. The designation of each block intended for erasing is determined according to a set value of an unillustrated erase block designation register included in the mode control circuit. The erase block designation register can be accessed from outside via the input/output terminals I/O0 through I/O7.

FIRST DETAILED EXAMPLE OF FLASH MEMORY

Figure 1:
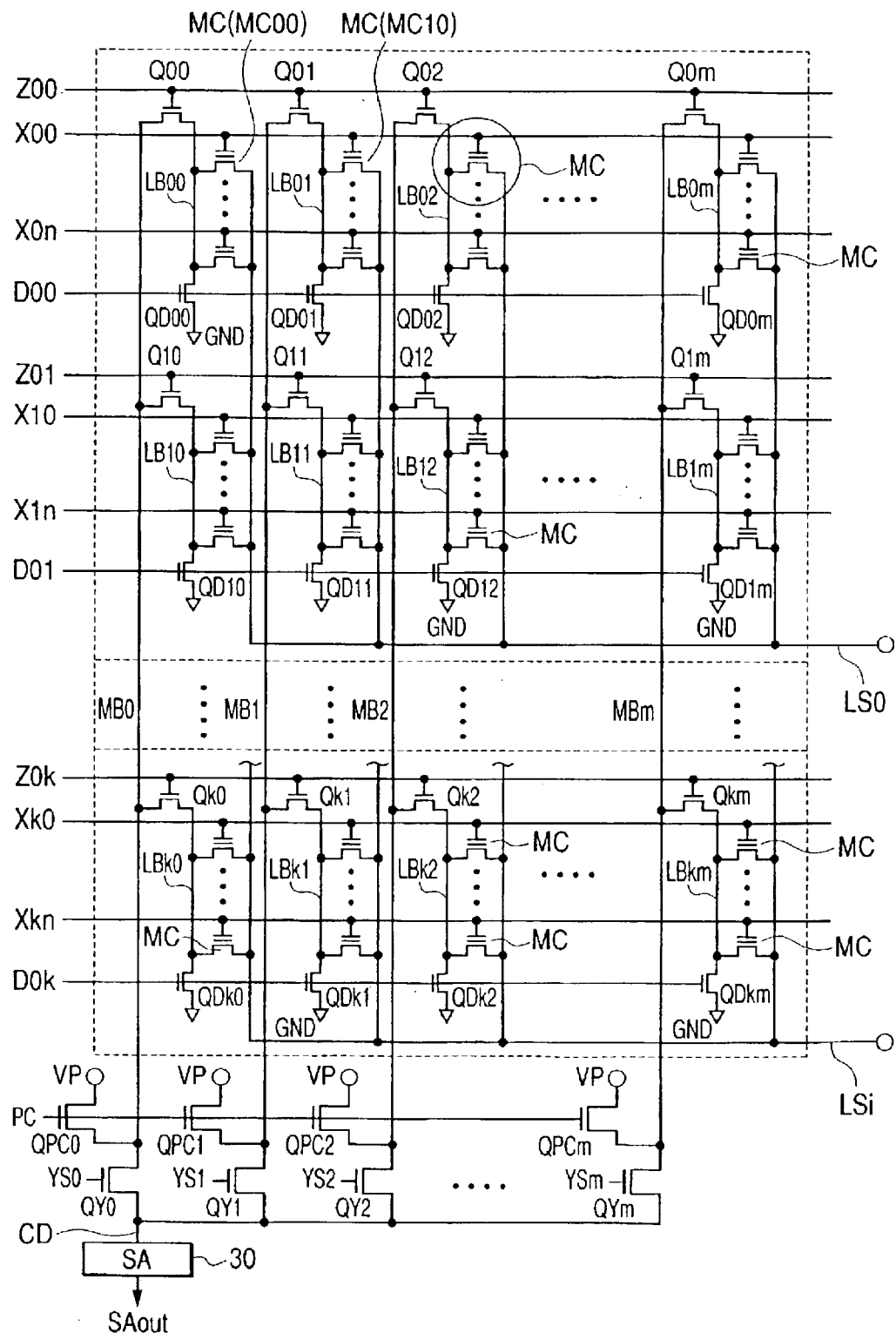
FIG. 1 is a circuit diagram showing the details of a flash memory according to one embodiment of the present invention with a memory mat as a principal base.

A memory mat of the flash memory 1 is illustrated in FIG. 1 by way of example. A configuration corresponding to one sense amplifier (SA) 30 is illustrated in the same drawing by way of example. In the same drawing, CD indicate a common data line, QY0 through QYm indicate main bit line selection switches (column switch elements), MB0 through MBm indicate main bit lines, LB00 through LBkm indicate sub bit lines, Q00 through Qkm indicate sub bit line selection switches, and MCs indicate the flash memory cells, respectively. The drains of the flash memory cells MCs are connected to their corresponding sub bit lines LB00 through LBkm, and the sources thereof are connected to their corresponding common source lines LS0 through LSi. In the present example, the erasing minimum unit is defined as a common source line unit.

Control gates of the flash memory cells MCs are connected to their corresponding main word lines X00 through Xkn in row units. The sub bit line selection switches Q00 through Qkm are connected to their corresponding sub word lines Z00 through Z0k in row units.

The main bit line selection switches QY0 through QYm are connected to their corresponding column select signal lines YS0 through YSm.

In the example of FIG. 1, n-channel type clamp MOS transistors (precharge MOS transistors) QPC0 through QPCmg for respectively clamping the main bit lines MB0 through MBm to a precharge voltage are connected to their corresponding main bit lines MB0 through MBm in advance. The gates of the clamp MOS transistors QPC0 through QPCm are controlled by a precharge signal PC. Theoretical clamp levels of the main bit lines MB0 through MBm are respectively set as potentials reduced by threshold voltages of the clamp MOS transistors QPC0 through QPCm from the level of the precharge signal PC.

n-channel type discharge MOS transistors (discharge switch) QD00 through QDkm connected to a circuit ground potential GND are provided for the sub bit lines LB00 through LBkm. The gates of the discharge MOS transistors QD00 through QDkm are respectively controlled by discharge signals D00 through D0k.

Figure 4:
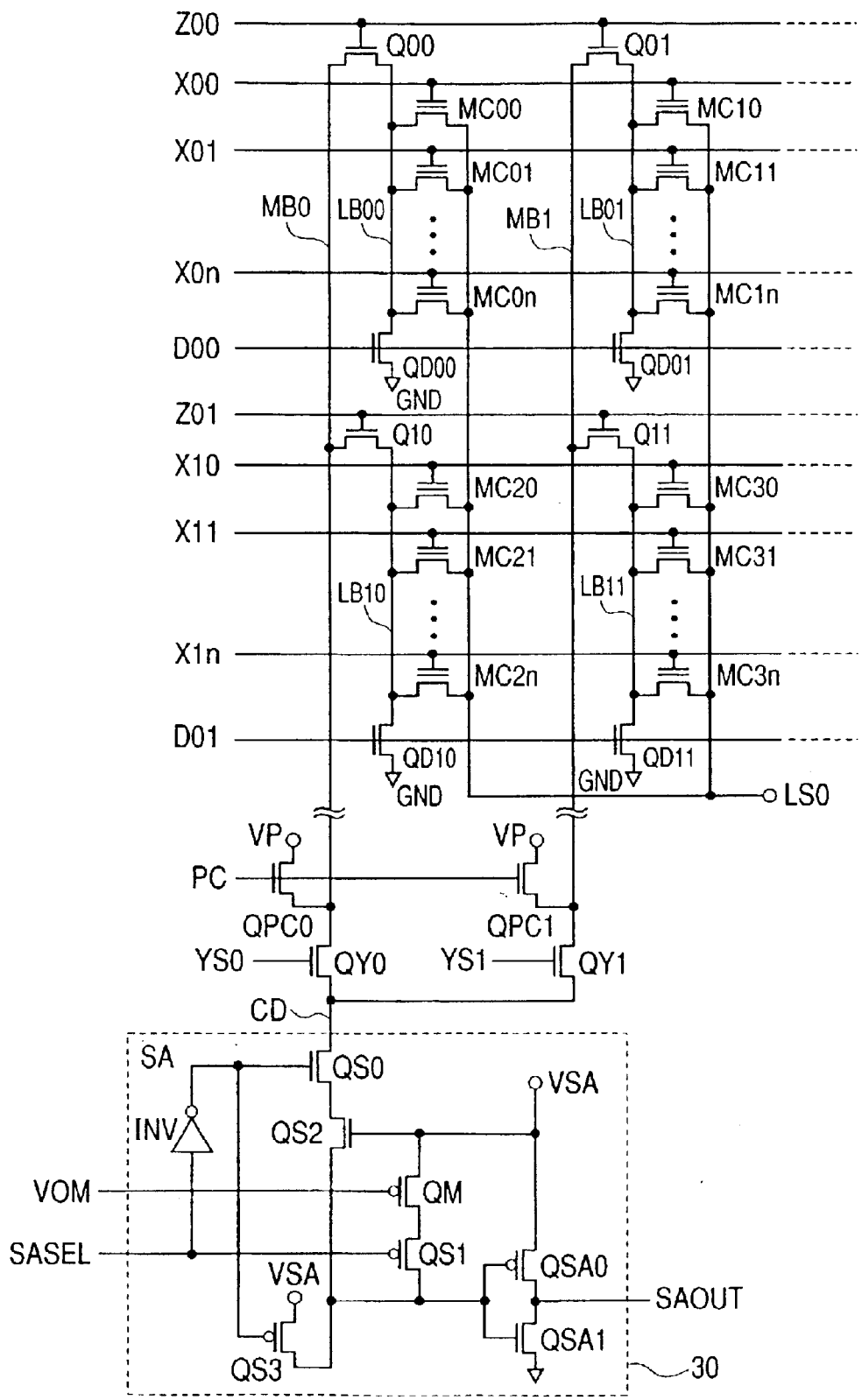
FIG. 4 is a circuit diagram specifically illustrating part of the memory mat shown in FIG. 1 and a sense amplifier.
Figure 5:
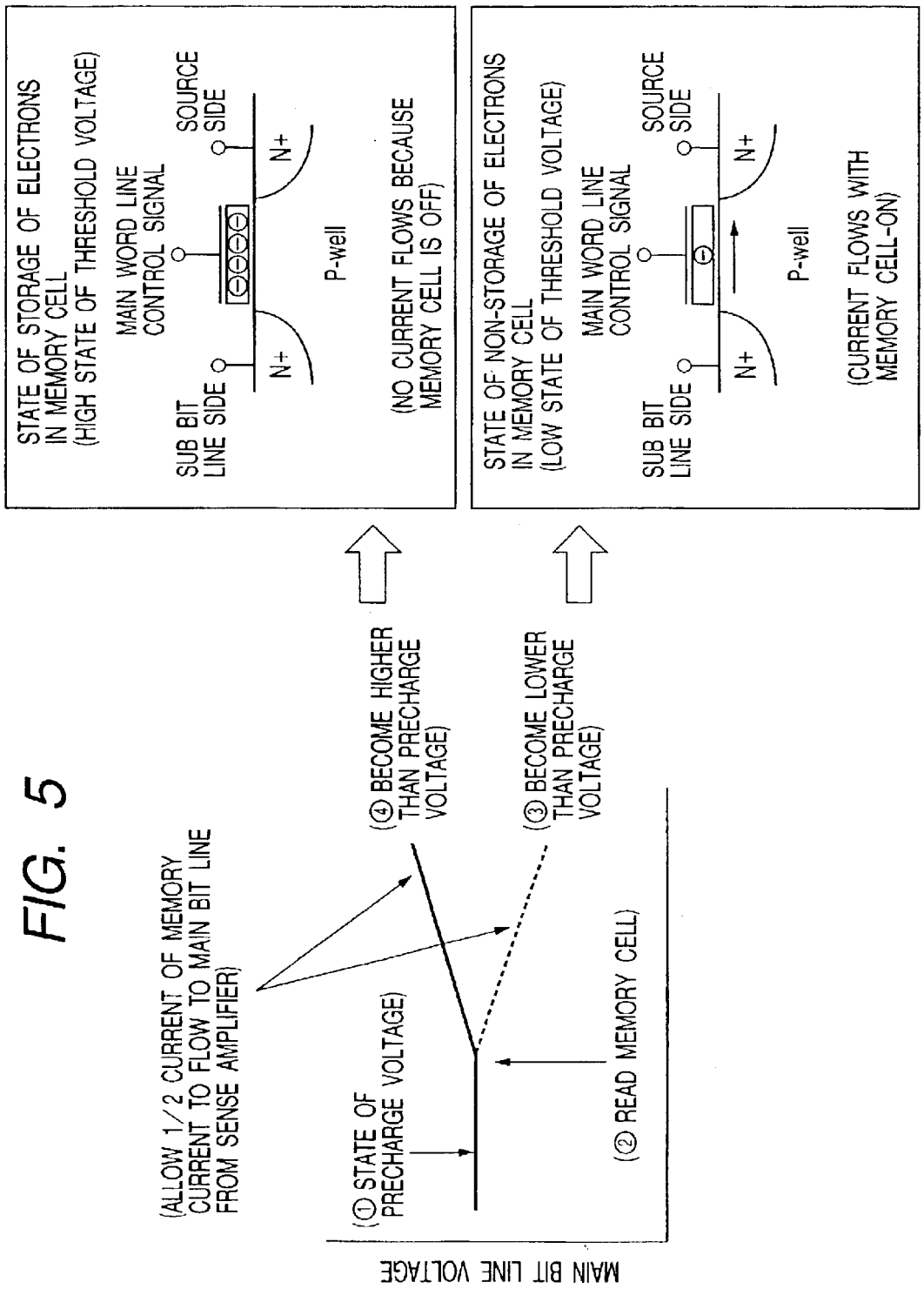
FIG. 5 is an explanatory view showing a read operation of a current sense type in principle.

A specific example illustrative of part of the memory mat and sense amplifier 30 shown in FIG. 1 is shown in FIG. 4. Although not restricted in particular, the sense amplifier 30 shown in the same drawing has a current voltage transformation type circuit configuration. A sense operation of the current voltage transformation type sense amplifier (current sense type circuit) is intended to supply a current (½ current) equivalent to substantially one-half the current flowing in a flash memory cell held in an on state when selected by the corresponding word line, to its corresponding bit line to thereby detect a change in bit line level with respect to a criterion level. More specifically, the bit line is precharged to the criterion level of the sense amplifier 30 as illustrated in FIG. 5 by way of example. When the sense amplifier 30 is activated, the sense amplifier supplies the current equivalent to substantially one-half the current flowing in the flash memory cell held in the on state, to the corresponding bit line. When, at this time, the corresponding flash memory cell intended for selection is in a write state in which its threshold voltage is relatively high, the flash memory cell is brought to an off state, so that the level of the bit line gradually rises from the criterion level. When the flash memory cell intended for selection is in a write state in which its threshold voltage is relatively low, the flash memory cell is brought to an on state, so that the level of the bit line gradually drops from the criterion level. The sense amplifier 30 detects a change in the level of the bit line.

According to FIG. 4, the sense amplifier 30 has as an output circuit, a CMOS inverter comprising a p-channel type MOS transistor QSA0 and an n-channel type MOS transistor QSA1. A common data line CD is connected to the input of the CMOS inverter via series-connected n-channel type MOS transistors QS0 and QS2. Upon operation non-selection of the sense amplifier 30 (SASEL="H (High level)"), an input node of the CMOS inverter is precharged to a voltage VSA via a p-channel type MOS transistor QS3. Upon operation selection (SASEL="L (low level)") of the sense amplifier 30, the half current defined under conductance control of a p-channel type MOS transistor QM is supplied to the common data line CD via the MOS transistors QS1, QS2 and QS0. VSA indicates an operation power supply voltage of the sense amplifier, and VOM indicates a conductance control voltage for obtaining the ½ current.

Figure 6:
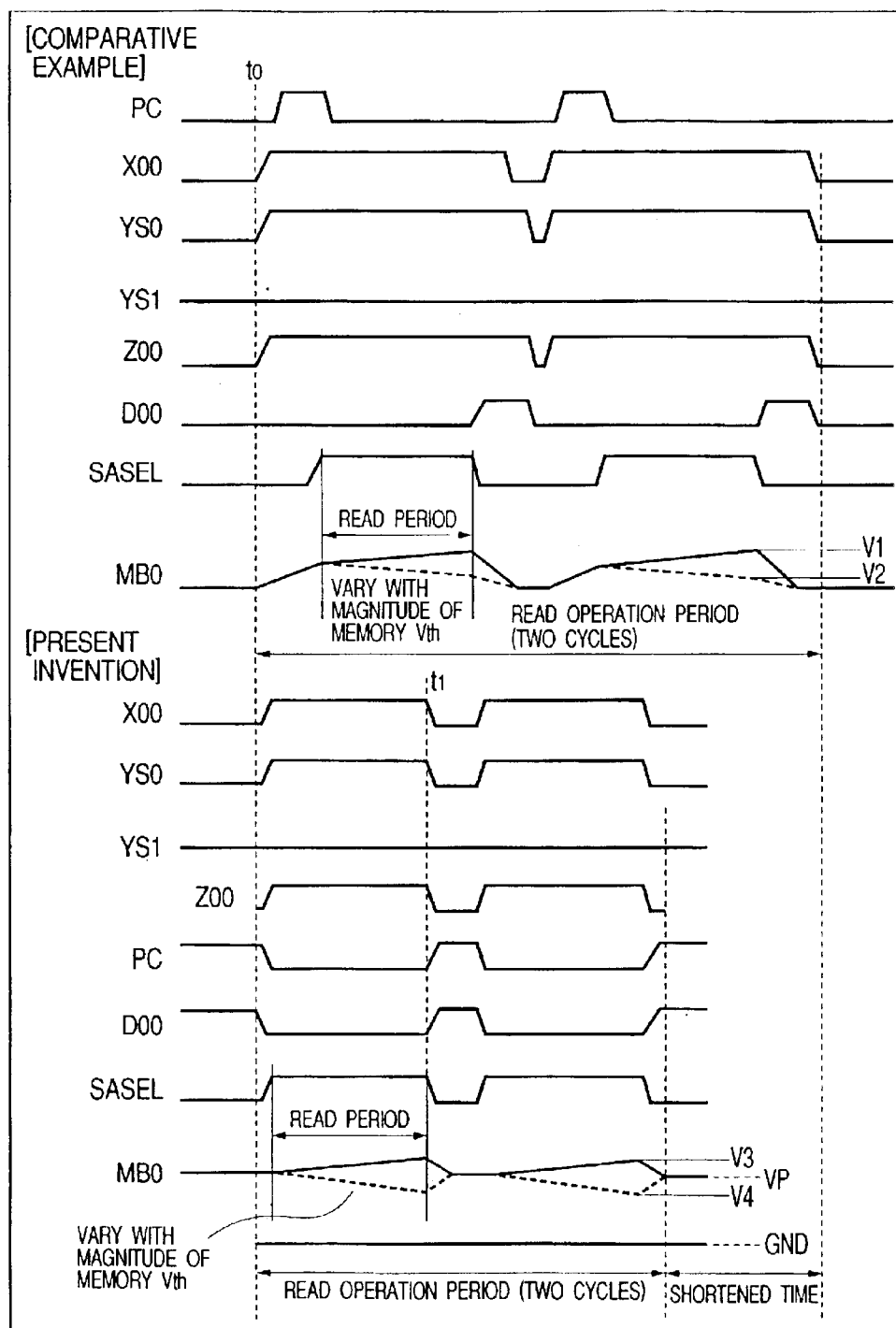
FIG. 6 is a timing chart depicting a read operation of the flash memory shown in FIG. 1 together with a comparative example.

A timing chart showing a read operation is illustrated in FIG. 6 by way of example. Timings provided when the memory cell MC00 of FIG. 4 is intended for reading in adherence to such a configuration as shown in FIGS. 1 and 4, are illustrated in the column of the present invention in the same drawing.

According to the configuration shown in FIGS. 1 and 4, when the memory cell is in a state prior to memory cell reading at a time antecedent to a time t0, the precharge MOS transistors QPC0 through QPCm are respectively set to an on state, the main bit line selection switches QY0 through QYm and the sub bit line selection switches Q00 and Qkm are respectively set to an off state, and a clamp power supply VP is connected to the main bit lines MB0 through MBm. As to the sub bit lines LB00 through LBkm, the discharge switches QD00 through QDkm are respectively brought to an on state so as to take a ground potential GND. Thus, the main bit lines MB0 through MBm are respectively clamped to a potential approximately equal to the criterion level of the sense amplifier 30.

When the read operation is instructed at the time t0, the precharge switches QPC0 through QPCm are respectively brought to an off state, and the discharge switches QD00 through QD0m are respectively brought to an off state. In order to select the flash memory cell MC00 intended for access, select signals YS0 and Z00 are thereafter set to a select level to thereby allow the sub bit line LB00 to conduct into the main bit MB0. Thus, the sense amplifier 30 supplies the ½ current to the drain of the memory cell. When the select signal Z00 is set to the select level to make the sub bit line LB00 conductive to the main bit line MB0, the main bit line MB0 has been clamped to the criterion level in advance, and the parasitic capacitance of the sub bit line LB00 is smaller than that of the main bit line MB0. Therefore, there is no possibility that the level of the main bit line MB0 will be undesirably lowered under the influence of the sub bit line LB00 brought into conduction. Immediately thereafter, the sense amplifier is thus capable of proceeding to the operation of selecting the memory cell MC00 by a main word line control signal X00. During a read period shown in FIG. 6, the memory cell MC00 is selected by the main word line control signal X00. When no electrons are stored in the memory cell MC00, the threshold voltage of the memory cell MC00 is low. When a control signal is supplied to the main word line X00, a current flows in the memory cell MC00. On the other hand, when the electrons are stored in the memory cell MC00, the threshold voltage of the memory cell MC00 is high, and no current flows in the memory cell MC00 even when the control signal is applied to the main word line X00.

When the current equivalent to one-half the memory cell current is caused to flow in the main bit line MB0, the ½ current flows in the memory cell MC00 where the threshold voltage of the memory cell MC00 is low, so that the voltage on the main bit line MB0 becomes lower than the clamp voltage and changes as indicated by a broken line in the column of the present invention in FIG. 6. Since the current equivalent to ½ the memory cell current flows in the main bit line MB0 where the threshold voltage of the memory cell MC00 is high, the voltage on the main bit line becomes higher than the clamp voltage and changes as indicated by a solid line in the column of the present invention in FIG. 6.

The sense amplifier 30 determines a logic value of information stored in each memory cell according to whether the main bit line voltage becomes higher or lower than the clamp voltage, and outputs the result of its determination as data SAOUT.

After the reading of the memory information (time t1), the main word line control signal X00 is returned to a non-select level (low level) to set the memory cell MC00 to a non-selected state, whereby the selected main bit line MB0 is separated from the common data line CD by the signal YS0, and the selected sub bit line LB00 is separated from the main bit line MB0 by the signal Z00. Thereafter, the sub bit lines LB00 through LB0m are made conductive to the ground potential GND via the discharge switches QD00 through QD0m by the signal D00, and the precharge switches QPC0 through QPCm are turned on by the signal PC to thereby precharge the main bit lines MB0 through MBm to the corresponding clamp voltage. Since, at this time, the precharge control signal PC is a high voltage of such a degree that substrate effects of the precharge switches QPC0 through QPCm can be neglected, the voltages are reduced via the precharge switches if the voltages on the main bit lines are higher than the clamp voltage, whereas if the voltages on the main bit lines are lower than the clamp voltage, the voltages rise via the precharge switches. Thus, a voltage clamp operation is performed so that the main bit lines reach the clamp voltage.

Figure 7:
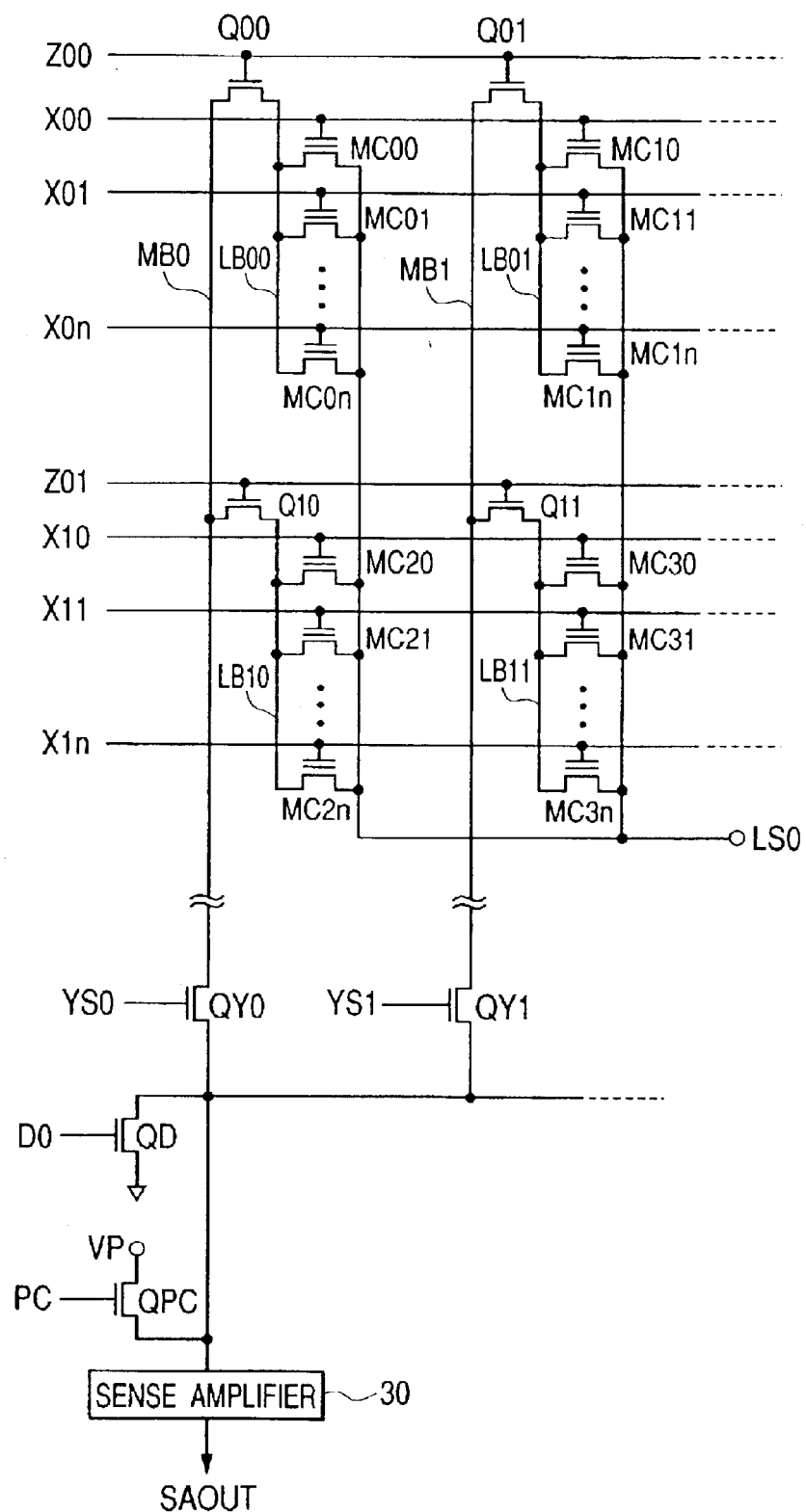
FIG. 7 is a circuit diagram illustrating a configuration of a flash memory according to the comparative example.

Operation timings described in the column of the comparative example of FIG. 6 are ones showing operations of a flash memory having a configuration according to a comparative example of FIG. 7. In FIG. 7 as compared with the configuration shown in FIGS. 1 and 4, the precharge switches QPC0 through QPCm and discharge MOS transistors QD00 through QD1m are omitted.

A description will be made of a case in which, for example, the memory cell MC00 is intended for access. When a read operation is instructed in the circuit configuration of the comparative example, a sub bit line LB00 is made conductive to its corresponding main bit line MB0 via a switch MOS transistor Q00, so that the main bit line MB0 is made conductive to a common data line CD via a selection MOS transistor QY0. In parallel with it, a precharge MOS transistor QPC is turned on so that a precharge operation based on a voltage VP for each of the main bit line MB00 and sub bit line LB00 is started. The precharge operation corresponds to an operation for charge-up from a ground potential GND. As compared with the case in which the main bit lines are clamped to the clamp voltage in advance as shown in the timing chart according to the present invention, the precharge operation needs a great long time to obtain a predetermined precharge potential. When the precharge voltage is reached, the precharge switch MOS transistor QPC is turned off. Afterwards, the memory cell MC00 is selected based on a main word line control signal X00, and memory information of the memory cell is detected from the magnitude of the voltage of the main bit line MB0 when a current flows from the sense amplifier 30 side to the memory cell, followed by output of the memory information. After the reading of the memory information, the main word line control signal X00 is inverted to a non-select level so that the corresponding memory cell is brought to a non-selected state. Thereafter, a discharge MOS transistor QD is turned on to discharge both the sub bit line LB00 and the main bit line MB0 to the ground potential GND. If the ground potential GND is reached, the main bit line selection MOS transistor QY0 and the sub bit line selection switch Q00 are respectively brought to an off state to separate the sense amplifier 30 and the memory cell from each other.

As is apparent from a comparison between a signal waveform on the main bit line MB0 in the comparative example of FIG. 6 and a signal waveform on the main bit line MB0 in the present invention, the present invention is capable of shortening necessary precharge and discharge times.

A precharge time, a discharge time and precharge/discharge operations between a comparative example and the present invention are respectively illustrated in FIG. 8 by comparison. As to the precharge time, the comparative example must wait for the time required to complete the step-up or boosting of the voltage from a ground level GND to a criterion level. On the other hand, the present invention may simply await the time required to form a clamp voltage used as a criterion level from voltages V3 and V4 upon completion of reading.

As to the discharge time, the corresponding main bit line and the corresponding sub bit line must be discharged from voltages V1 and V2 to the ground level GND upon completion of reading in the case of the comparative example. In the case of the present invention, only the corresponding sub bit line may be discharged from the voltages V3 and V4 to a ground level GND upon completion of reading.

As to the precharge/discharge operations, the comparative example performs a precharge operation before the reading of memory information from each memory cell and carries out a discharge operation after the reading of the memory information. In the present invention, a clamp operation based on precharge for each main bit line and a discharge operation for each sub bit line can be performed in parallel after the reading of memory information.

Thus, when respective read operation periods of two cycles are compared as illustrated in the waveform diagrams of the main bit lines MB0 of FIG. 6, a time reduction can be realized a few 10% in the present invention as compared with the comparative example.

Since the drain (sub bit line) of each memory cell is held at the ground potential, there is no problem of memory disturb. Since the time required to charge the main bit line becomes predominant, the time necessary for its precharge can be shortened by clamping the main bit line to the precharge voltage in advance. While both the main bit and sub bit lines have heretofore been discharged and set as the ground potential after the completion of reading, only each sub bit line is discharged. Clamping the main bit line to the precharge voltage simultaneously with its discharge makes it possible to shorten the time necessary for charge and discharge. Since the discharge and precharge are simultaneously performed, the reading speed of a non-volatile semiconductor memory device becomes fast. Since the operating speed of the non-volatile semiconductor memory device becomes fast, the whole system can be speeded up.

SECOND DETAILED EXAMPLE OF FLASH MEMORY

Figure 9:
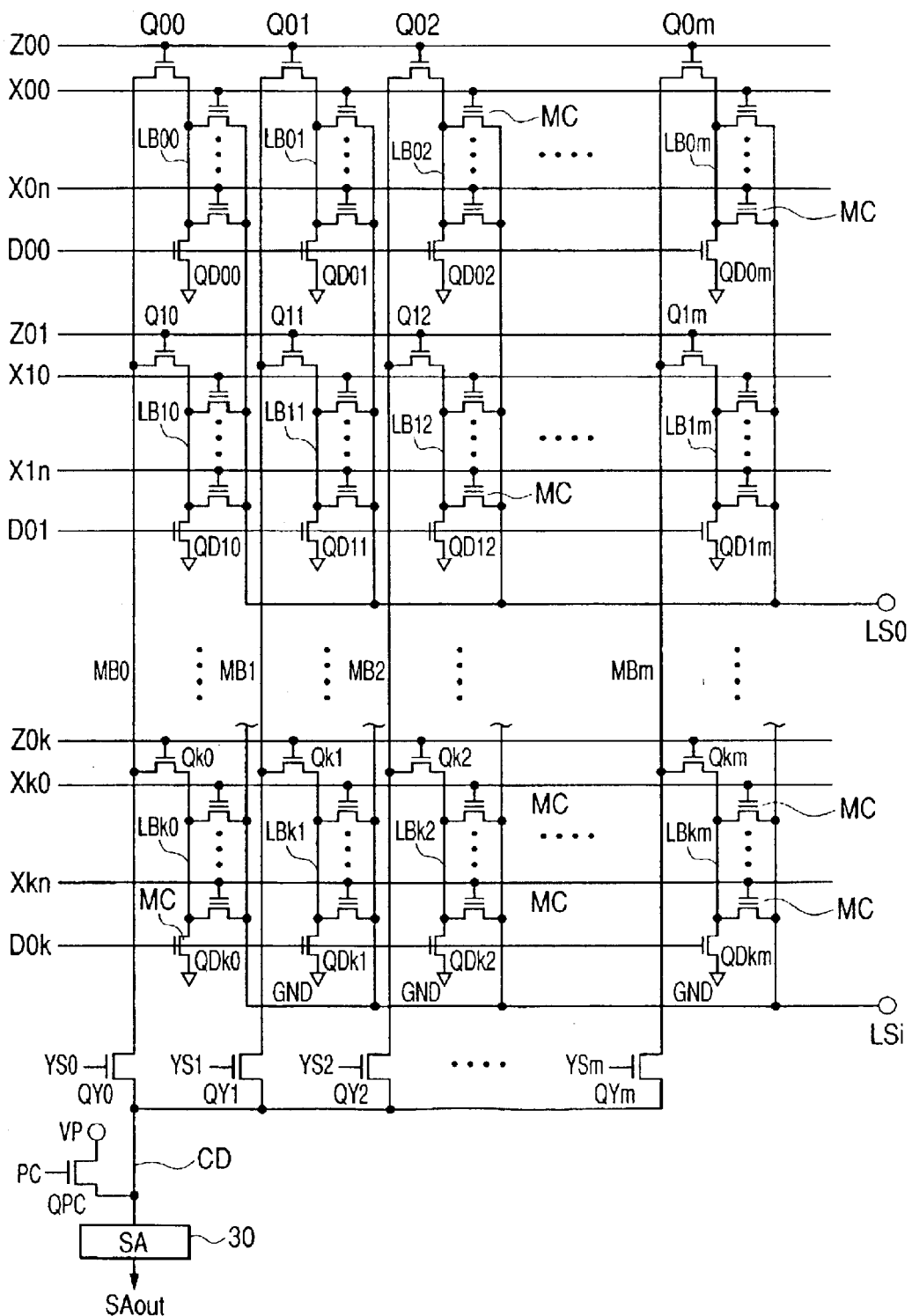
FIG. 9 is a circuit diagram showing a second detailed example of a flash memory.

A second detailed example of a flash memory is shown in FIG. 9. The second detailed example is different from the configuration of FIG. 1 in that a precharge MOS transistor QPC is disposed at a common data line CD.

Figure 10:
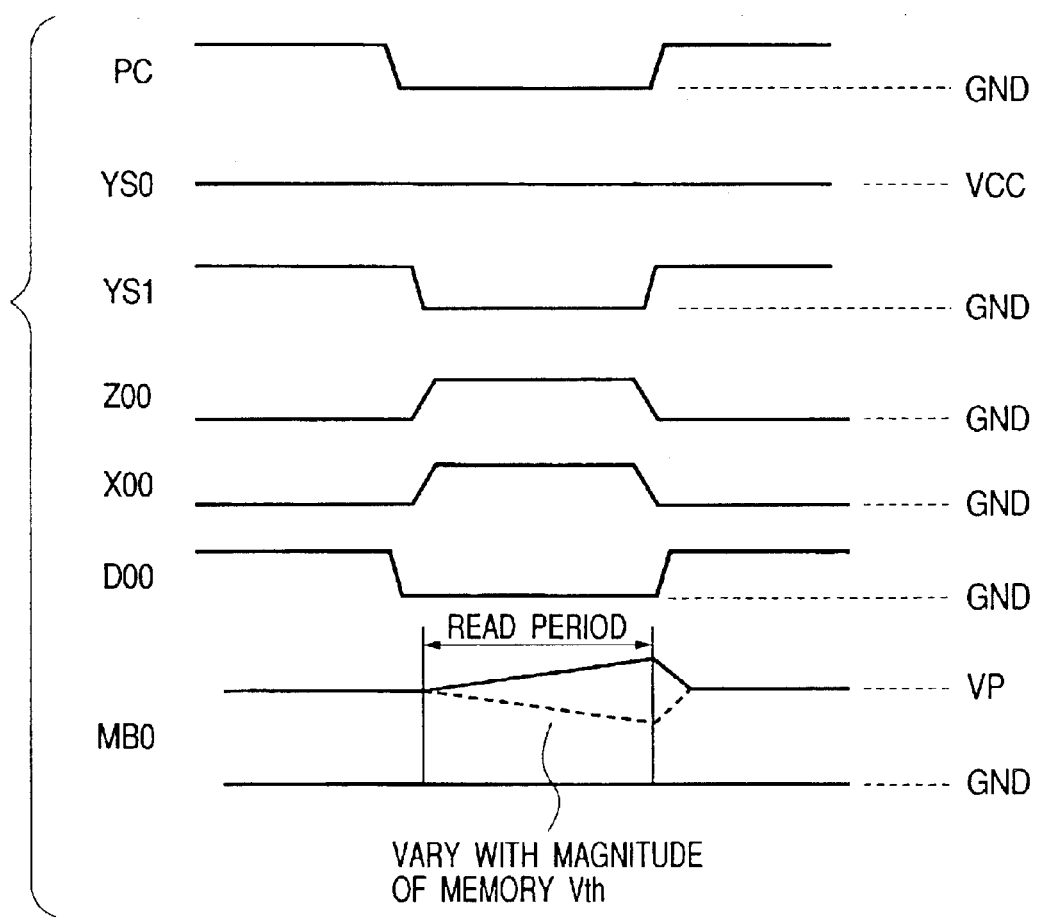
FIG. 10 is a timing chart illustrating the operation of reading memory information of a memory cell MC00 in a configuration of FIG. 9.

A timing chart showing the operation of reading memory information of a memory cell MC00 in a configuration of FIG. 9 is illustrated in FIG. 10 by way of example. During a non-selection period of the memory cell, i.e., during a period in which all of sub bit line selection switches are respectively held in an off state, all the main bit line selection switches QY0 through QYm are brought to an on state, so that a clamp voltage is supplied from a precharge MOS transistor QPC via them. Upon the selecting operation of each memory cell, only the main bit line selection MOS transistor for the selected main bit line is held in the on state, and the others are respectively inverted to an off state. According to such a configuration, the number of the precharge MOS transistors can be reduced.

THIRD DETAILED EXAMPLE OF FLASH MEMORY

Figure 11:
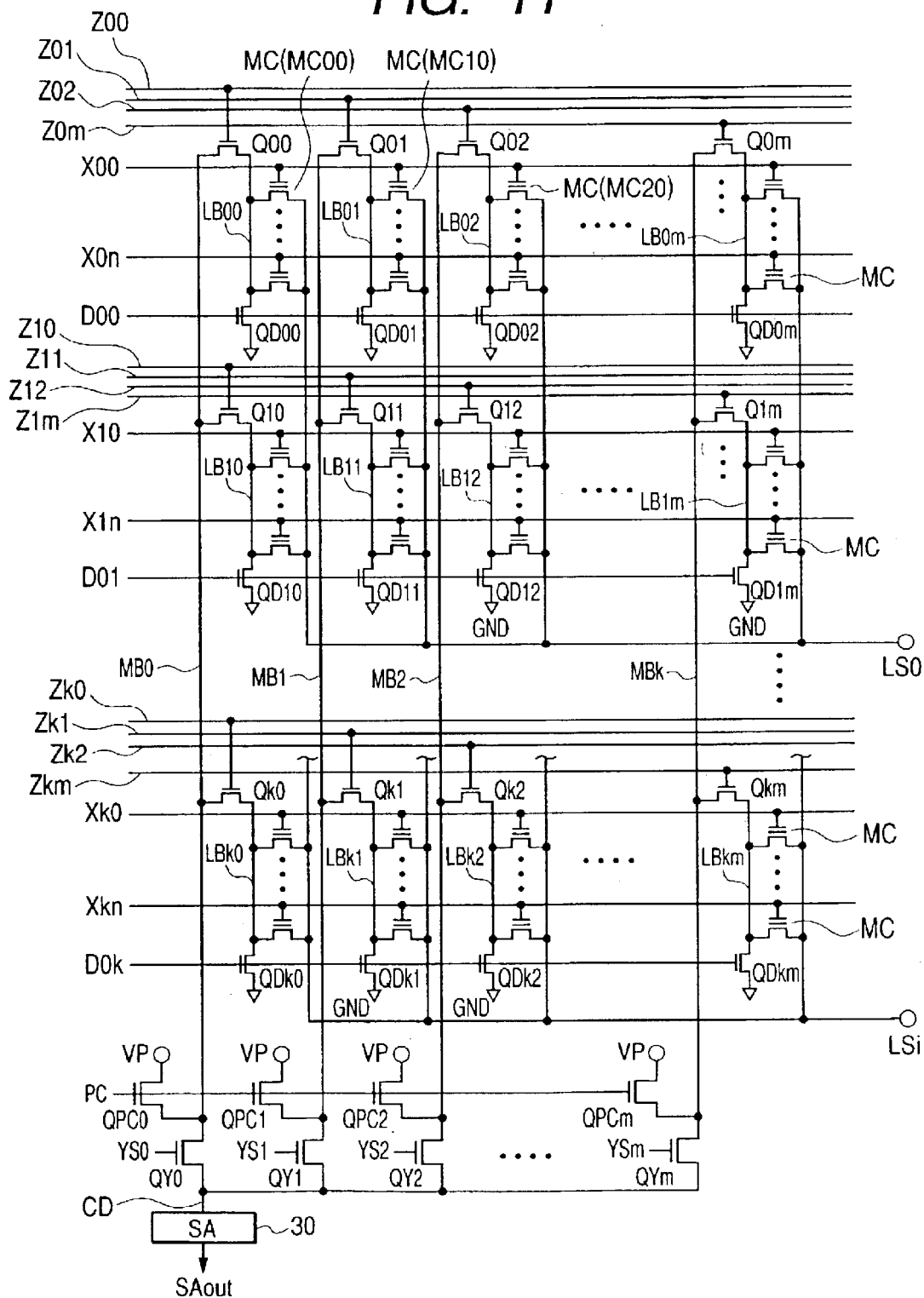
FIG. 11 is a circuit diagram showing a third detailed example of a flash memory.

A third detailed example of a flash memory is shown in FIG. 11. The third detailed example is different from the configuration of FIG. 1 in that sub bit line selection switches Q00 through Qkm are selected by individual control signals Z00 through Zkm. The present configuration is intended to suppress needless power consumption of each access-nonselected memory cell.

That is, in the configuration shown in FIG. 1, when, for example, the memory cell MC00 is selected, the main bit line selection switch QY0 selects the main bit line MB0 to bring the sub word line control signal Z00 and main word line control signal X00 to the select level. Since, at this time, all the sub word line selection switches Q00 through Q0m sharing the sub word line control signal Z00 are held on, the corresponding memory cell low in threshold voltage, of other memory cells MCs sharing the use of the main word line control signal X00 together with the memory cell MC00 is not intended for access but turned on to discharge an electrical charge on the corresponding main bit line from the common source line. Such a discharge operation will cause an increase in power consumption and an increase in main bit line precharge operating time after the completion of accessing.

In the configuration of FIG. 11, the sub bit line selection switches Q00 through Qkm can be selected every sub bit lines. When, for example, a memory cell MC00 is intended for access, a main bit line selection switch QY0 selects a main bit line MB0 to thereby bring a sub word line control signal Z00 and a main word line control signal X00 to a select level. Consequently, the sub bit line selection switch brought to an on state corresponds to Q00 alone. Other sub bit line selection switches Q01 through Q0m disposed in the same row are respectively brought to an off state. Thus, even if other memory cells MCs sharing the use of the main word line control signal X00 together with the memory cell MC00 are turned on, electrical charges on the main bit lines are not discharged into a common source line via them.

FOURTH DETAILED EXAMPLE OF FLASH MEMORY

Figure 12:
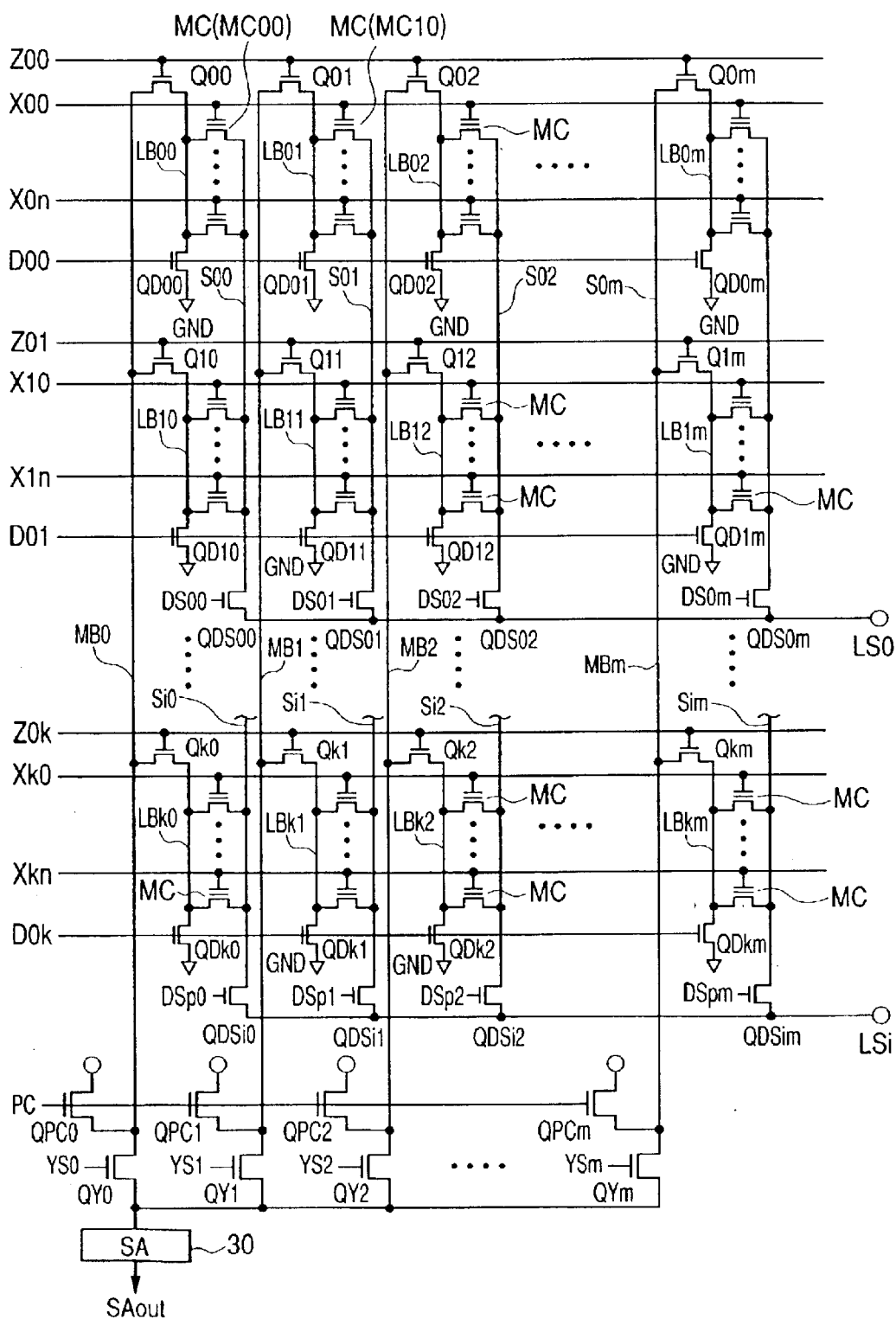
FIG. 12 is a circuit diagram depicting a fourth detailed example of a flash memory.

A fourth detailed example of a flash memory is shown in FIG. 12. The fourth detailed example is different from the configuration of FIG. 1 in that source discharge switches QDS00 through QDSim are provided every source lines S00 through Sim and respectively selected by individual control signals QDS00 through QDSim. The present configuration is intended to suppress needless power consumption of each access-nonselected memory cell on the source line side.

In the configuration shown in FIG. 12, the source discharge switches QDS00 through QDSim are capable of on operation every source lines S00 through Sim. When, for instance, a memory cell MC00 is intended for access, a main bit line selection switch QY0 selects a main bit line MB0 to bring a sub word line control signal Z00 and a main word line control signal X00 to a select level. At this time, the source discharge switch brought to an on state is QDS00 alone. Other source discharge switches QDS01 through QDS0m disposed in the same row are respectively brought to an off state. Thus, even if other memory cells MCs sharing the use of the main word line control signal X00 together with the memory cell MC00 are turned on, electrical charges on the main bit lines are not discharged into a common source line LS0 via them. FIG. 12 is compared with FIG. 11. Even if each memory cell not intended for access is brought to an on state, the electrical charge on each main bit line is not discharged toward its corresponding sub bit line in the configuration shown in FIG. 11. In the configuration of FIG. 12 on the other hand, when each memory cell not intended for access is turned on, an electrical charge on the corresponding main bit line is discharged from its corresponding sub bit line to a source line but does not reach the common source line. In this sense, the configuration of FIG. 11 is superior to that of FIG. 12 in the reduction in power consumption.

Figure 13:
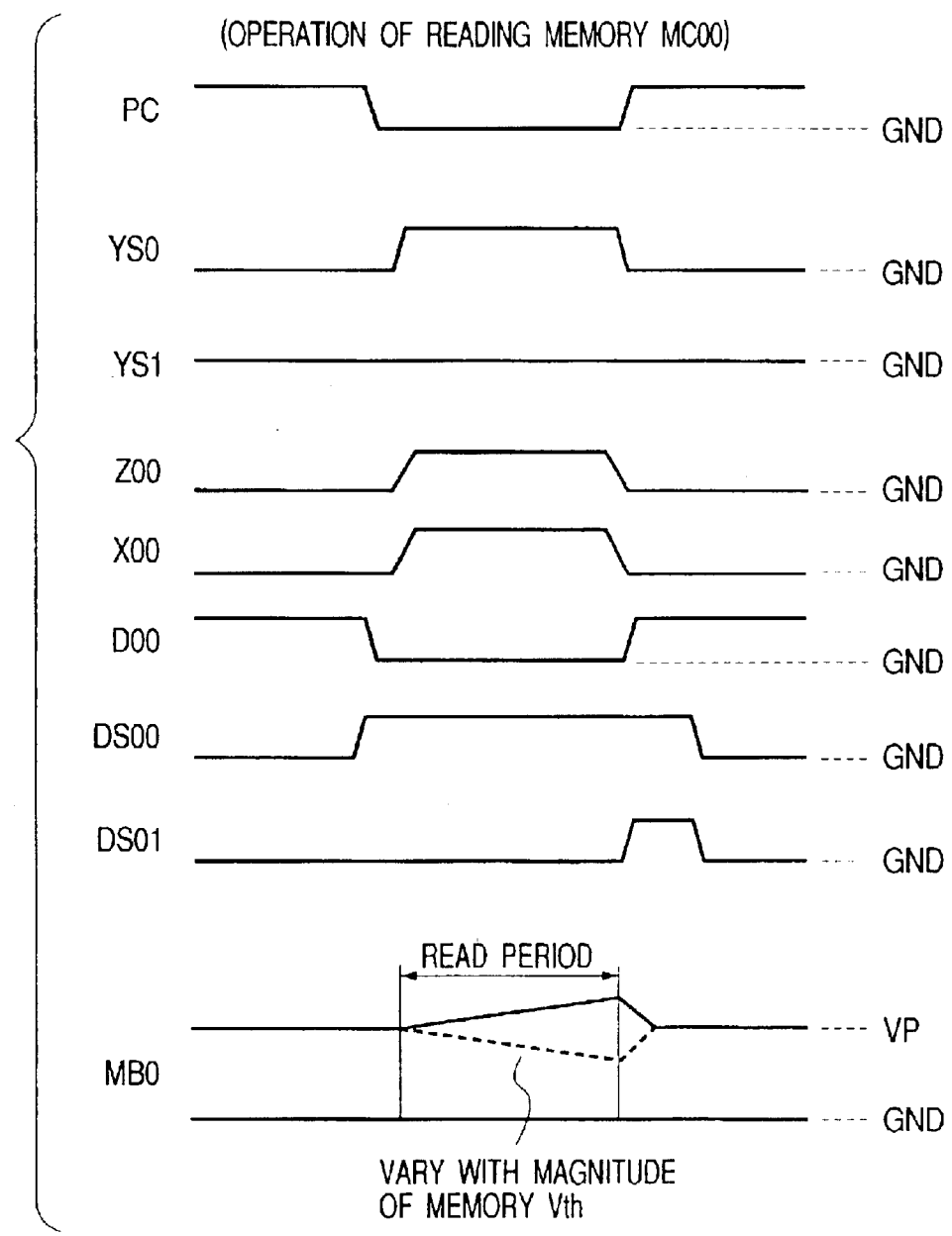
FIG. 13 is a timing chart showing a read operation executed in a configuration of FIG. 12.

Timings provided for a read operation made to the memory cell MC00 in the configuration of FIG. 12 are illustrated in FIG. 13. When the memory cell MC00 is accessed according to the select levels of YS0, Z00 and X00, DS00 for switch-controlling QDS00 connected with the corresponding access-aimed memory cell MC00 is brought to a select level, and other signals each typified by DS01 are respectively brought to a non-select level. Data read from the memory cell MC00 is determined, and YS0, Z00 and X00 are respectively inverted to a non-select level. Thus, all the switches QDS00 through QDSim are temporarily turned on in response to the discharge of their corresponding sub bit lines to initialize the source lines S00 through Sim into a ground potential GND.

FIFTH DETAILED EXAMPLE OF FLASH MEMORY

Figure 14:
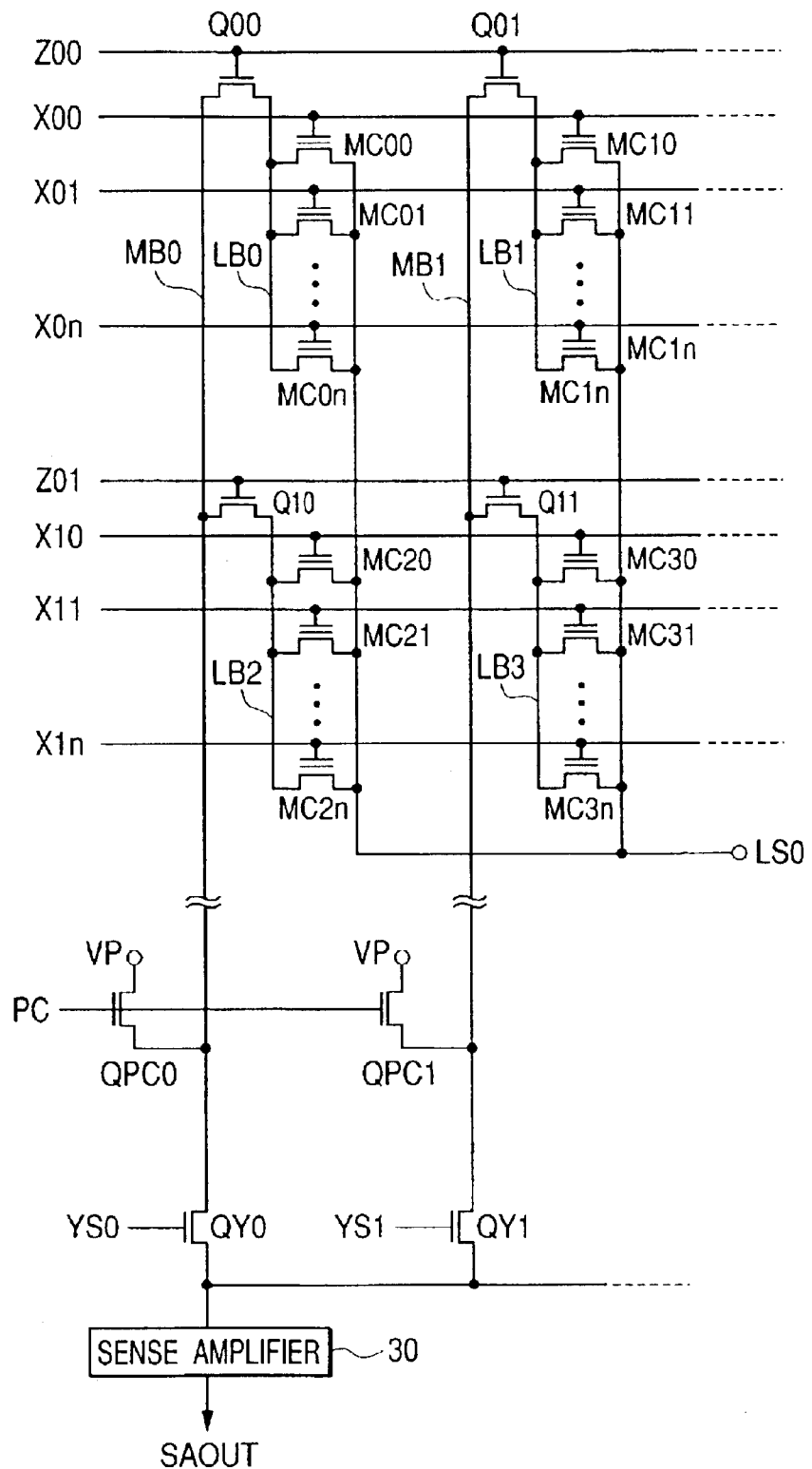
FIG. 14 is a circuit diagram illustrating a fifth detailed example of a flash memory.
Figure 15:
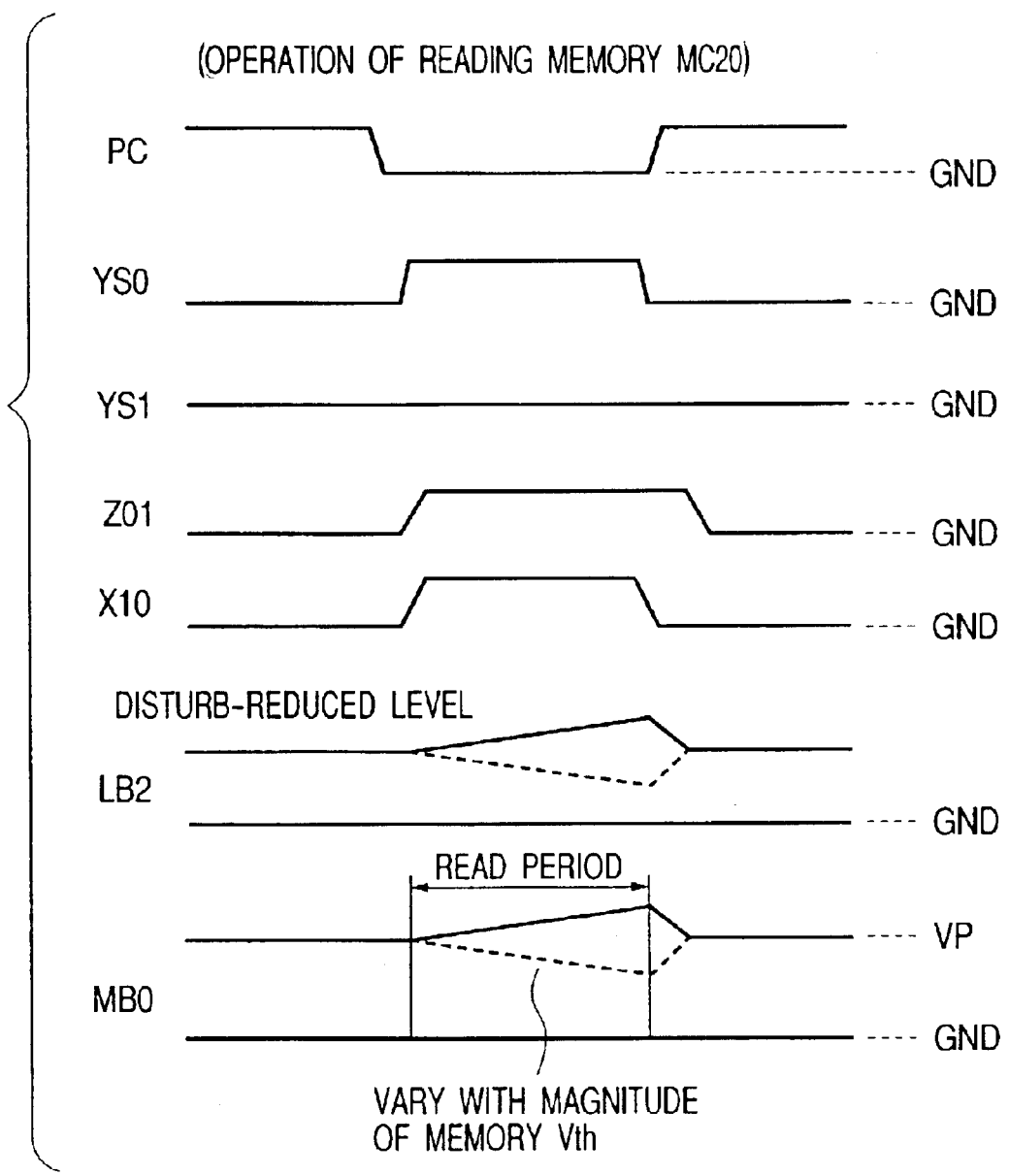
FIG. 15 is a timing chart depicting a read operation executed in a configuration of FIG. 14.

A fifth detailed example of a flash memory is shown in FIG. 14. Read operation timings of a memory cell MC20 shown in FIG. 14 are illustrated in FIG. 15 by way of example. The example shown in FIG. 14 is one wherein a clamp voltage is set to such a level as to reduce disturb of the memory cell. In short, a flash memory cell relatively strong in disturb resistance is used. Thus, the discharge of each sub bit line becomes unnecessary and hence discharge switches for the sub bit lines can be abolished.

SIXTH DETAILED EXAMPLE OF FLASH MEMORY

Figure 16:
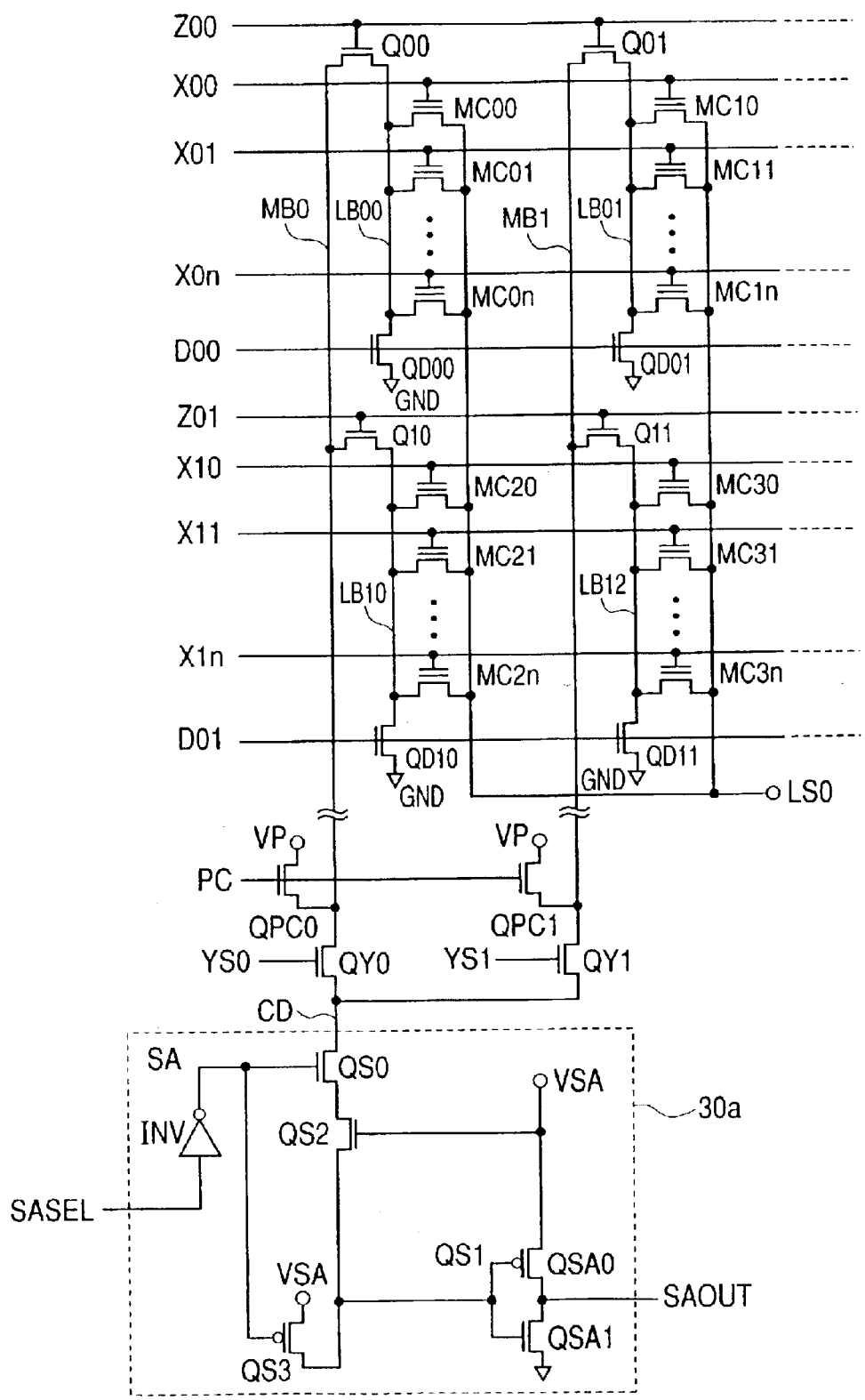
FIG. 16 is a circuit diagram showing a sixth detailed example of a flash memory.
Figure 17:
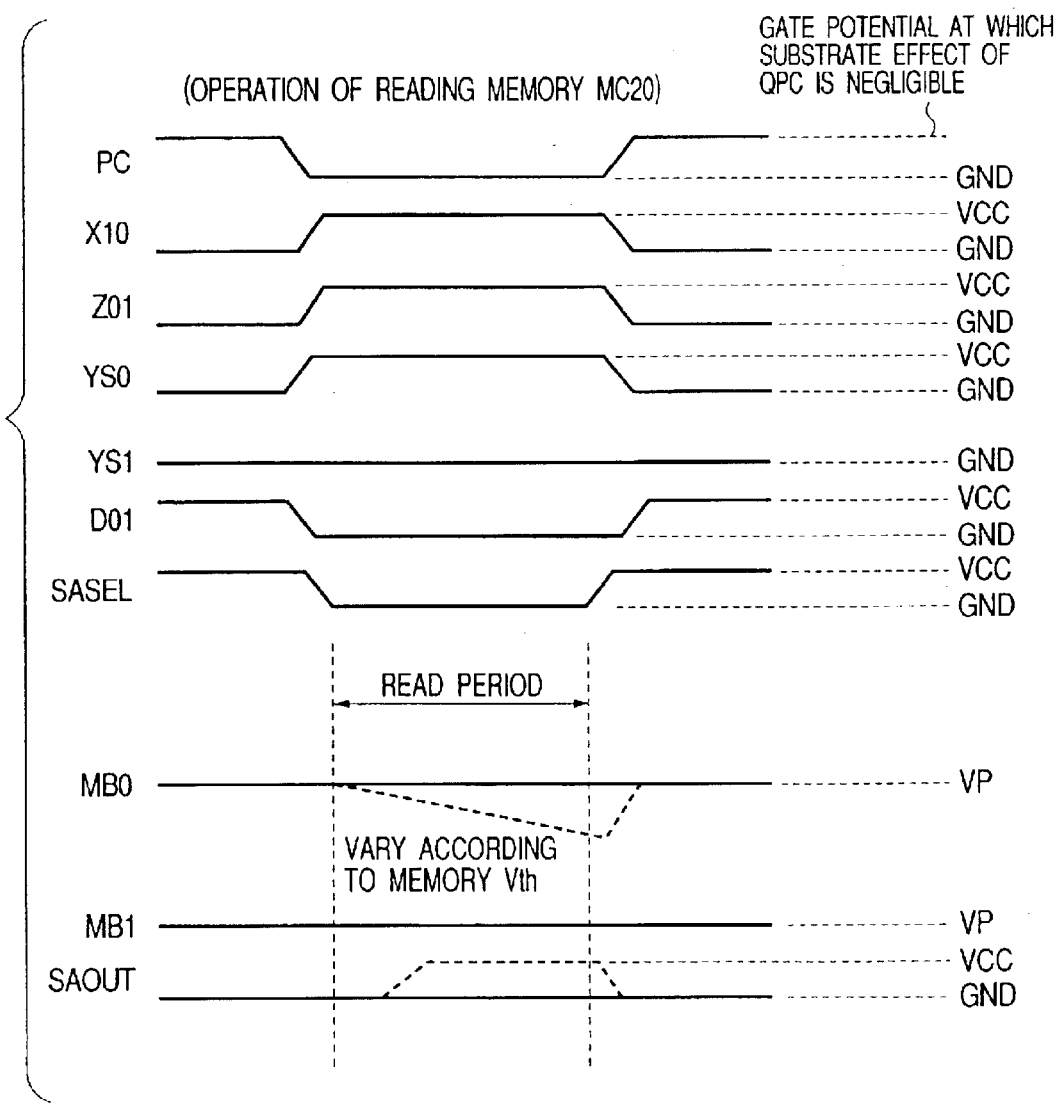
FIG. 17 is a timing chart depicting a read operation executed in a configuration of FIG. 16.

A sixth detailed example of a flash memory is shown in FIG. 16. Read operation timings of a memory cell MC20 shown in FIG. 16 are illustrated in FIG. 17 by way of example. A configuration shown in FIG. 16 is different from the configuration of FIG. 4 in that a sense amplifier 30a having such a configuration that the current equivalent to one-half the current flowing in the memory cell MC held on is not supplied to each main bit line, is adopted. In short, the transistors QM and QS1 in FIG. 4 are omitted in the sense amplifier 30a shown in FIG. 16. If the current equivalent to one-half the memory cell current does not flow in the main bit line upon the read operation, there is little voltage variation where the threshold voltage of each memory cell is high as in the case of a main bit line MB0 illustrated in FIG. 17 by way of example. When the threshold voltage of the memory cell is low, the voltage on the main bit line drops. If a sense level is set in between the voltage variations developed where the threshold voltage of the memory cell is high and low, the sense amplifier 30a can read information held in the corresponding memory cell.

SEVENTH DETAILED EXAMPLE OF FLASH MEMORY

Figure 18:
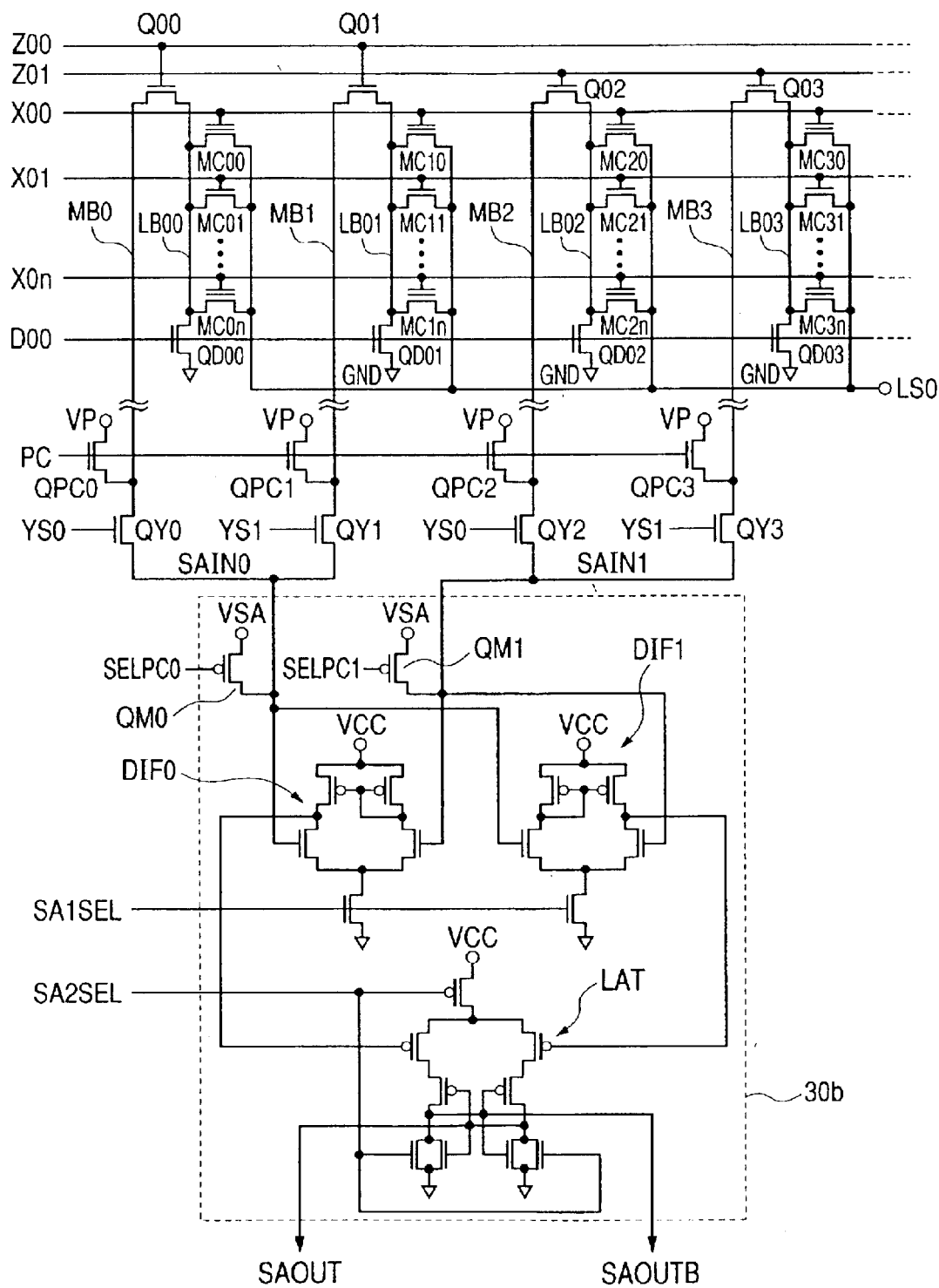
FIG. 18 is a circuit diagram showing a seventh detailed example of a flash memory.
Figure 19:
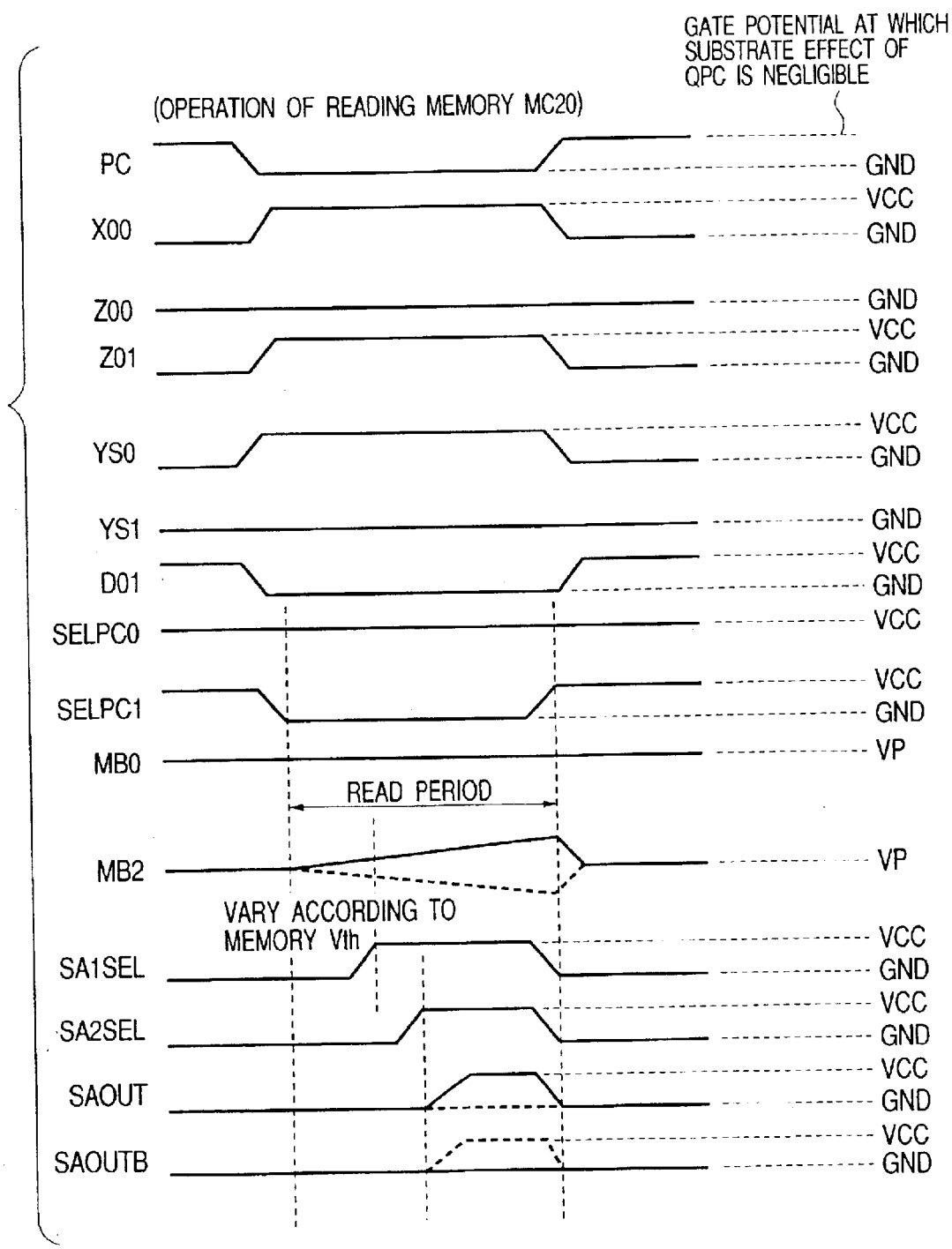
FIG. 19 is a timing chart illustrating read operation timings of a memory cell of FIG. 18.

A seventh detailed example of a flash memory is shown in FIG. 18. Read operation timings of a memory cell MC20 shown in FIG. 18 are illustrated in FIG. 19 by way of example. A configuration shown in FIG. 18 adopts a differential amplification type sense amplifier 30b. Bit line selection switches QY(2i) and QY(2i+2) sharing the use of a select signal YSi (where i=even number) are connected to common data lines SAIN0 and SAIN1 that constitute the input of the sense amplifier 30b. Similarly, bit line selection switches QY(2i−1) and QY(2i+1) sharing the use of a select signal YSi (where i=odd number) are connected thereto. p-channel type transistors QM0 and QM1 for selectively supplying the ½ current are connected to the common data lines SAIN0 and SAIN1 and switch-controlled by control signals SELPC0 and SELPC1, respectively. The common data lines SAIN0 and SAIN1 are connected to their corresponding differential input terminals of differential amplifier circuits DIF0 and DIF1. An inverted output and a non-inverted output taken out in single-end form from the differential amplifier circuits DIF0 and DIF1 are supplied to a sense latch LAT as complementary outputs, from which differential sense outputs SAOUT and SAOUTB are formed with complementary output levels as signals levels between a circuit ground level and a circuit power supply voltage VCC.

If a memory cell MC20 is intended for access as illustrated in FIG. 19, a control signal YS0 is set to a high level so that main bit lines MB0 and MB2 are made conductive to the common data lines SAIN0 and SAIN1. At this time, a transistor QM1 on the common data line SAIN1 side to which the access-aimed memory cell MC20 is connected, is turned on to allow a ½ current to be supplied to the memory cell MC20. In the common data line SAIN0 on the opposite side, a VP-based clamp level is set to a criterion level. As a matter of course, sub bit line selection switches Q00 and Q01 for the main bit lines MB0 and MB1 connected to the common data line SAIN0 on the criterion side are held off. Sub bit line selection switches Q02 and Q03 for the main bit lines MB2 and MB3 connected to the common data line SAIN1 on the read signal side are respectively brought to an on state.

EIGHTH DETAILED EXAMPLE OF FLASH MEMORY

Figure 20:
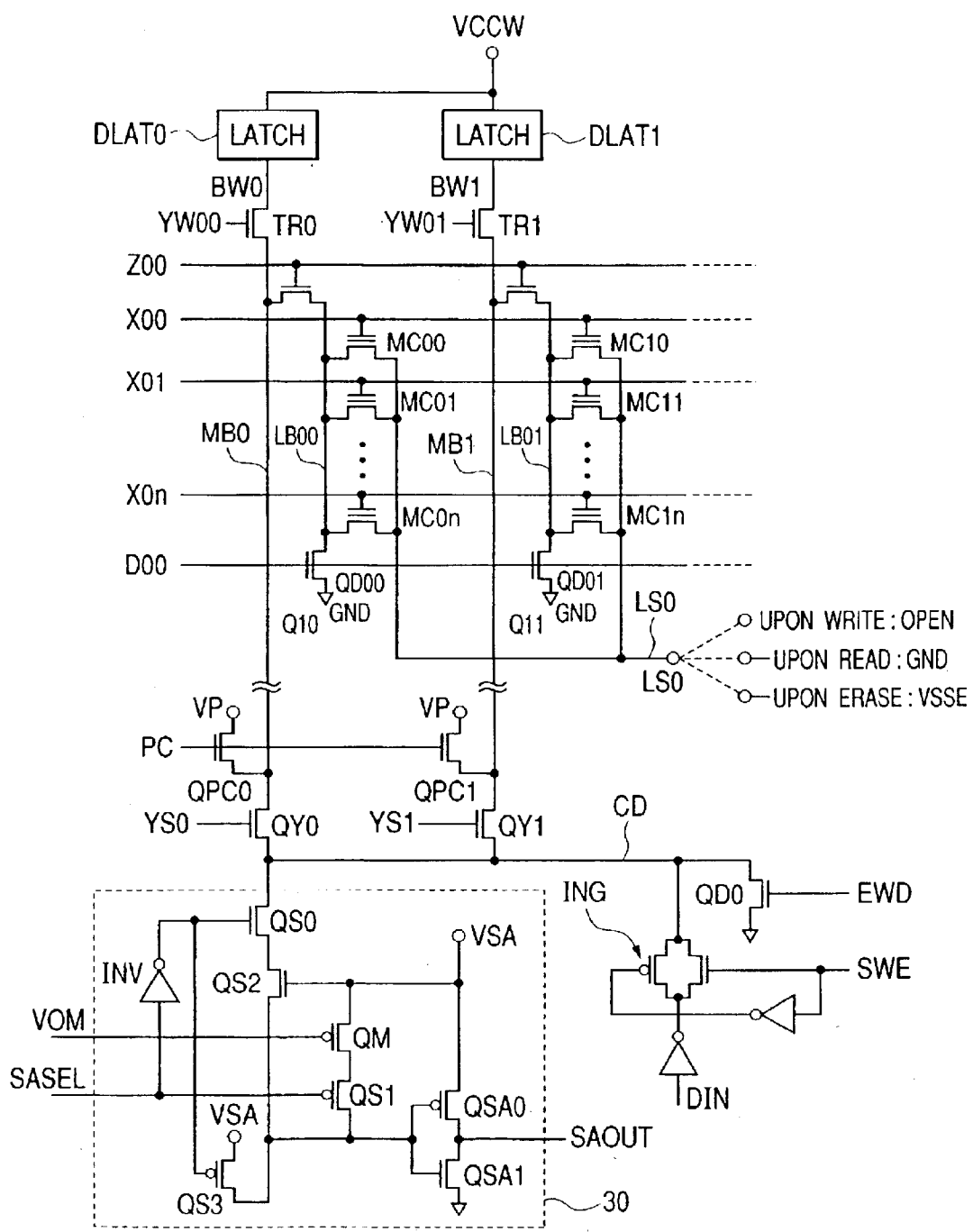
FIG. 20 is a circuit diagram showing an eighth detailed example of a flash memory.

An eighth detailed example of a flash memory is shown in FIG. 20. Write operation timings provided for the flash memory of FIG. 20 are illustrated in FIG. 21 by way of example, and read and erase operation timings provided for the flash memory shown in FIG. 20 are illustrated in FIG. 22 by way of example.

A configuration for writing, whose illustration has been omitted up to now, is also shown in FIG. 20. Latches DLAT0 and DLAT1 are connected to their corresponding main bit lines typified by MB0 and MB1 via transfer switches TR0 and TR1. An initializing discharge switch QD0 is connected to a common data line CD, and write data DIN can be inputted via an input gate ING.

A common source line typified by LS0 is rendered floating (poen) upon writing. Further, the common source line is set to a ground potential GND upon a read operation, and the common source line is set to an erase negative voltage VSSE upon an erase operation.

Figure 21:
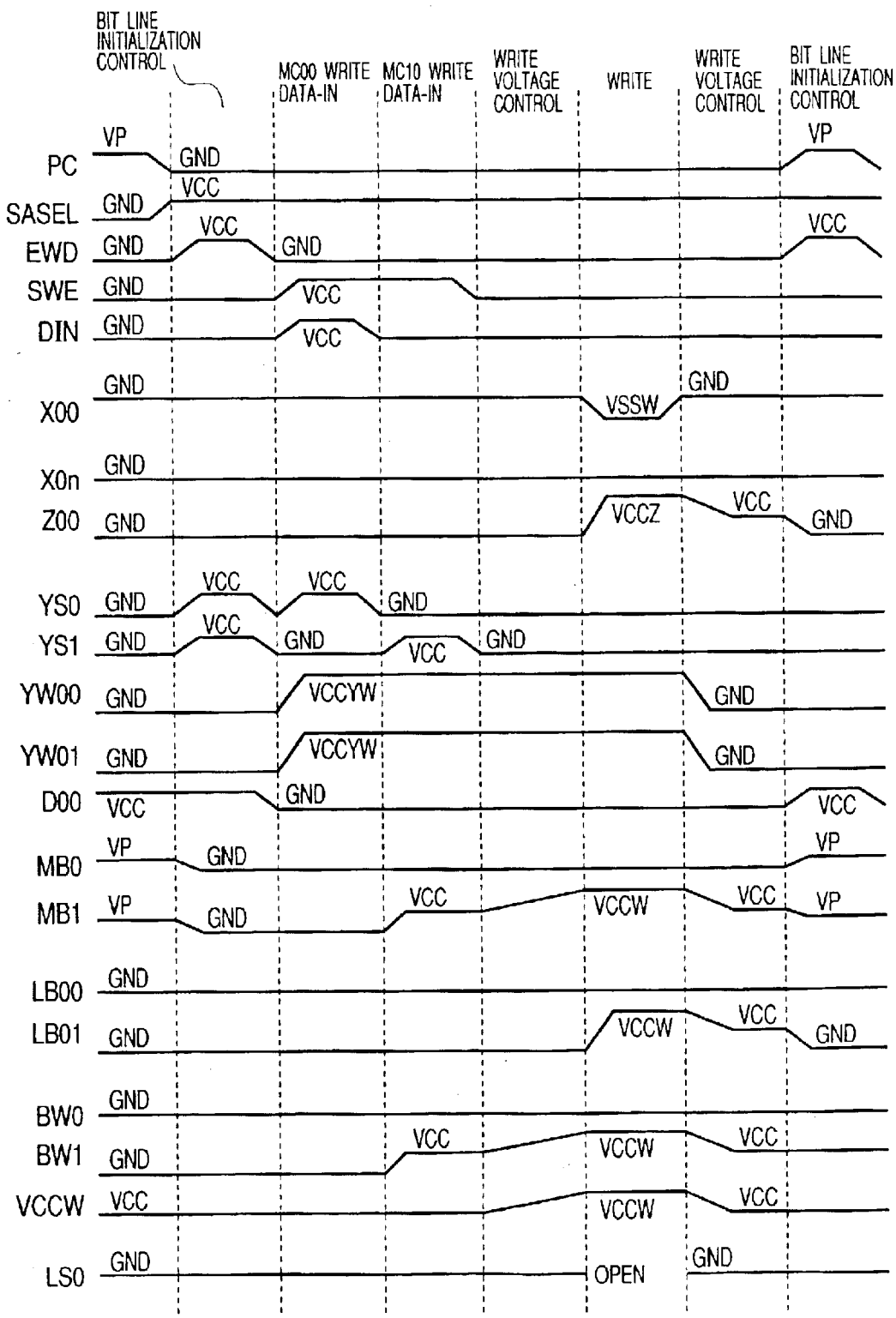
FIG. 21 is a timing chart illustrating write operation timings of the flash memory shown in FIG. 20.
Figure 22:
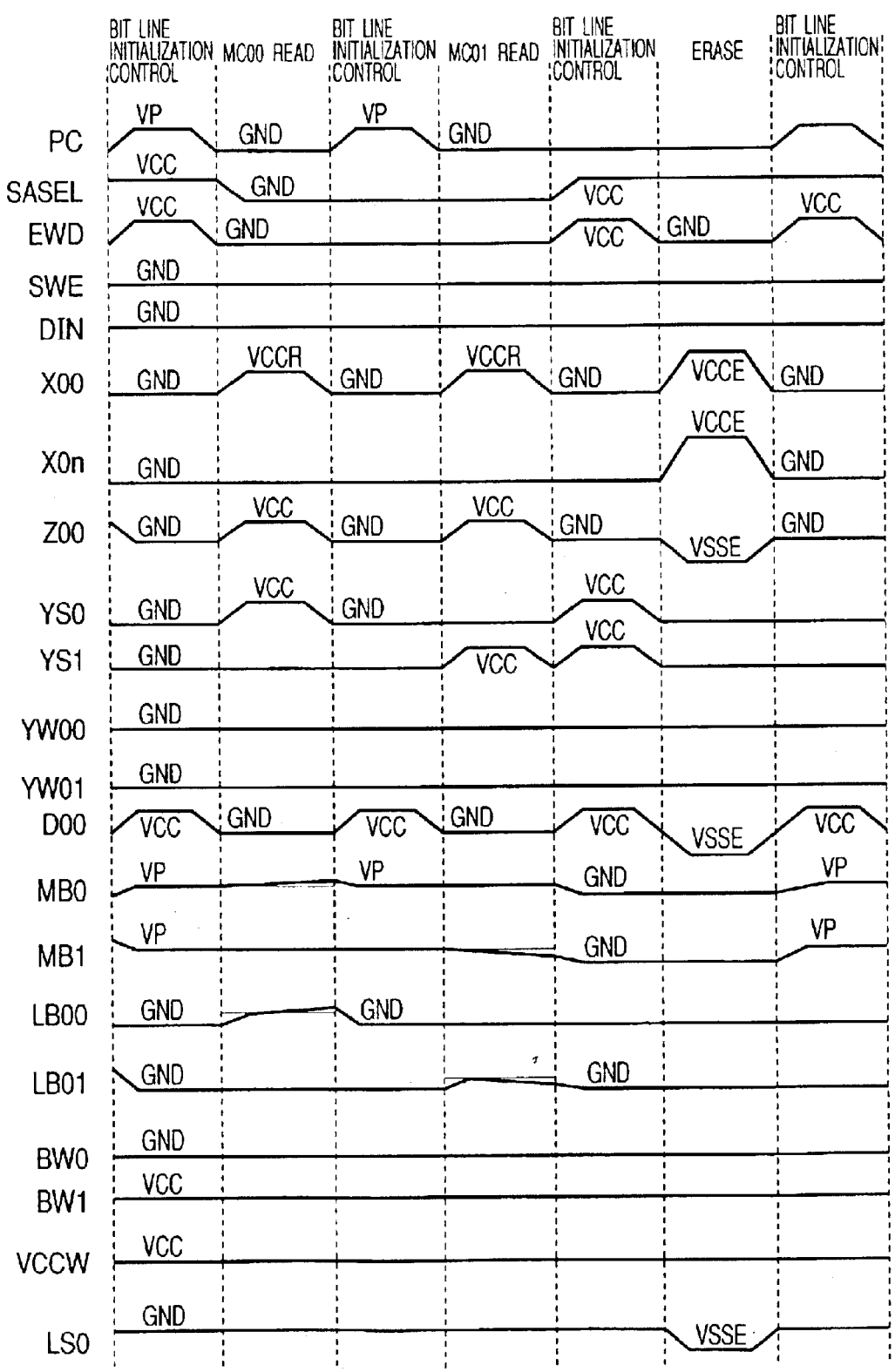
FIG. 22 is a timing chart illustrating read operation and erase operation timings of the flash memory shown in FIG. 20.

As illustrated in FIG. 21 by way of example, a main word line selected for writing is set to a negative high voltage VSSW, and its corresponding main bit and sub bit lines are set to a positive write high voltage VCCW or like to thereby inject hot electrons into the corresponding floating gate from a drain, whereby the writing is performed. The minimum unit for the erase operation is set as a source line unit. As illustrated in FIG. 22 by way of example, a negative high voltage VSSE is applied to the corresponding source line, and a positive high voltage VCCE or the like is applied to the corresponding main word line to thereby pull out or draw out electrons from the floating gate to the source, whereby the easing is performed.

As apparent from FIGS. 21 and 22, the main bit lines typified by MB0 and MB1 are respectively set to the ground voltage GND and the high voltage VCCW upon the write and erase operations. In such a case, it is needless to say that much charge time is required to no small extent until each of the main bit lines is clamped from such a voltage to a VP-based clamp voltage as compared with the read operation being continuously performed. Incidentally, a relationship between respective voltages in FIGS. 21 and 22 is represented as follows: Voltages designated at PC, VCCZ, VCCW and VCCYW are set as voltages unaffected by substrate effects of respective MOS switches. Further, a relationship of VSSE, VSSW<GND is established, and a relationship of GND<VP<VCC≦VCCR<VCCZ, VCCYW, VCCE is established.

<<Data Processor>>

Figure 3:
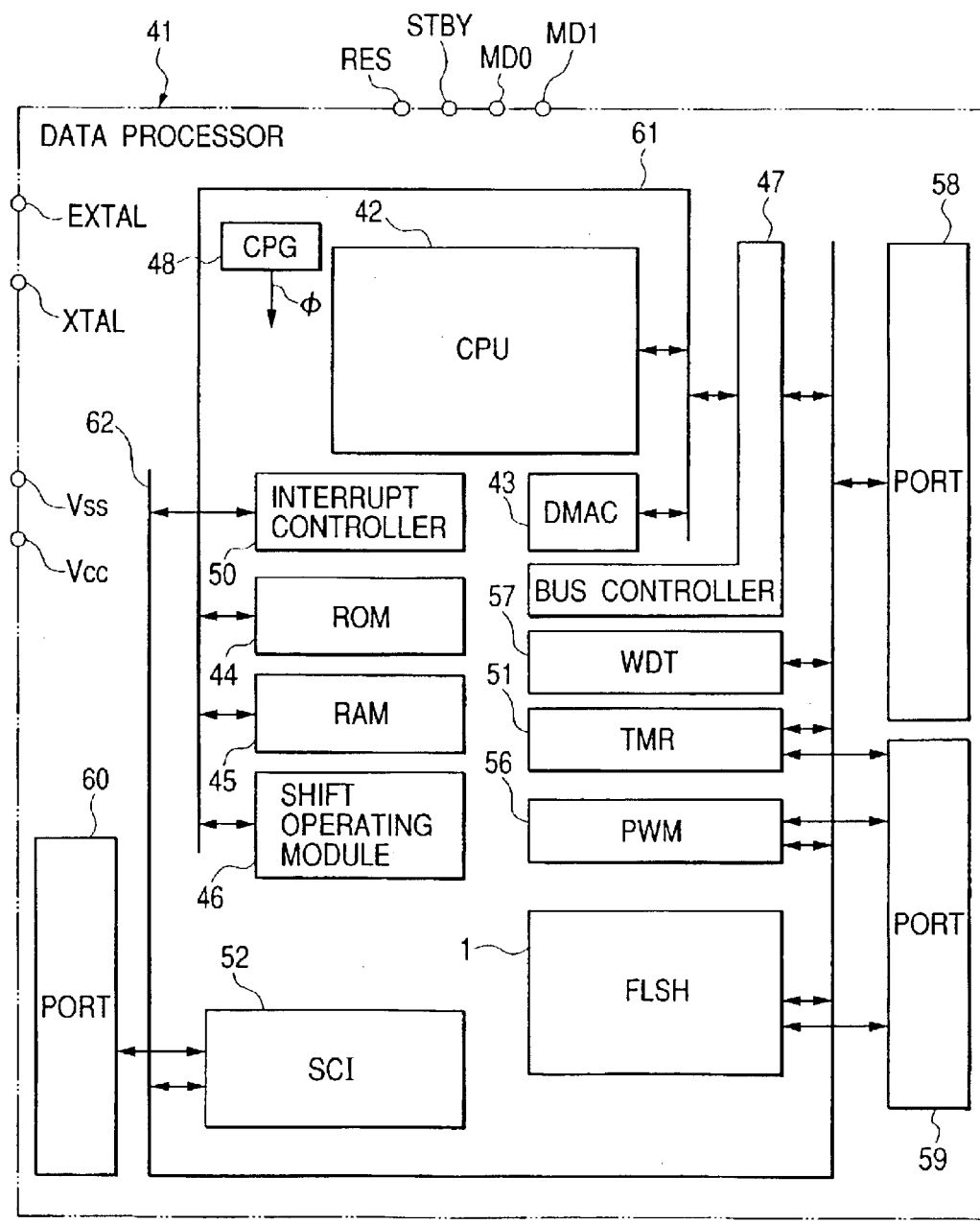
FIG. 3 is a block diagram of a data processor according to one embodiment of the present invention.

A data processor 41 showing one example of a semiconductor integrated circuit according to the present invention is shown in FIG. 3. The data processor 41 shown in the same drawing is formed on a single semiconductor substrate (semiconductor chip) like monocrystalline silicon by, for example, a CMOS integrated circuit manufacturing technology.

The data processor 41 includes a central processing unit (CPU) 42, a DMA controller (DMAC) 43, a read only memory (ROM) 44 corresponding to a program memory which stores a processing program, etc. for the CPU 42, a random access memory (RAM) 45 used for a working area of the CPU 42 and to temporarily store data, a shift operating module 46 capable of shift-operating arbitrary plural bits, a bus controller 47, a clock generator (CPG) 48, an interrupt controller 50, a timer counter (TMR) 51, a serial communication interface controller (SCI) 52, the flash memory (FLSH) 1, a pulsewise modulator (PWM) 56, a watchdog timer (WDT) 57, and input/output ports (PORT) 58 through 60. The CPU 42, DMAC 43, ROM 44, RAM 45, shift operating module 46 and bus controller 47 are connected to a CPU bus 61. The CPU bus 61 is interfaced to a peripheral bus 62 via the bus controller 47. The interrupt controller 50, TMR 51, SCI 52, FLAH 1, PWM 56, and WDT 57 are connected to the peripheral bus 62 as peripheral circuits. The CPU bus 61 and peripheral bus 62 respectively include a data bus, address bus and a control bus (control signal bus) The peripheral bus 62 is interfaced to an external bus (not shown) via the input/output port 58. The CPU bus 61 interfaces to the peripheral bus 62 via the bus controller 47 and further to the external bus via the input/output port 58. The input/output ports 59 and 60 respectively function as external interface buffers used for the peripheral circuits.

In the data processor 41, bus master modules correspond to the CPU 42 and DMAC 43. The CPU 42 includes an instruction controller which fetches an instruction from, e.g., the ROM 44 or FLSH 1 and decodes the fetched instruction, and an execution unit which performs arithmetic processing using a general-purpose register, an arithmetic and logic unit, etc. according to the result of instruction decoding by the instruction controller. The DMAC 43 includes a data transfer condition initially set by the CPU 42 and performs data transfer control in response to a data transfer request sent from each of the peripheral circuits or the like.

The bus controller 47 effects arbitration on competition in bus right request between the CPU 42, DMAC 47 and external bus master corresponding to the bus master modules. Arbitration logic indicates arbitration control based on precedence, for example. As a result of arbitration, the bus master module given the bus right outputs a bus command, and the bus controller 47 controls the corresponding bus based on the bus command. The bus controller 47 outputs address signals and an access strobe signal to the outside via the input/output port 58 where an address signal outputted from the bus master module means an external address space of the data processor 41.

The interrupt controller 50 inputs an interrupt request signal (not shown) outputted from the circuit module of the SCI 52 or the like connected to the peripheral bus 62 and effects priority control and mask control on the input interrupt request signal to thereby accept an interrupt request. The interrupt controller 50 outputs an interrupt request signal (not shown) to the CPU 42 when it has accepted an interrupt. When the CPU 42 is given the interrupt request signal, the CPU 42 discontinues or interrupts processing being in execution and causes a branch to a predetermined processing routine corresponding to an interrupt factor. At the last of the processing routine corresponding to the branch destination, a return instruction is executed and the interrupted processing can be resumed by executing the instruction.

In addition, the data processor 1 has external terminals for a ground level (Vss) and a power supply voltage level (Vcc) or the like as power terminals. Besides, the data processor 1 includes respective terminals for a reset input (RES), standby (input STBY), mode control inputs (MD0, MD1), and a clock input (EXTAL, XTAL) as dedicated control terminals.

Although not restricted in particular, the CPG 48 generates a system clock signal φ, based on an external clock signal inputted to a crystal oscillator or EXTAL terminal connected to the terminals EXTAL and XTAL.

When the data processor 41 is supplied with the reset signal RES, the on-chip circuit modules such as the CPU 42, etc. are brought to a reset state. When the reset state based on the reset signal RES is released, the CPU 42 reads an instruction from a predetermined start address and starts execution of a program. According to it, the CPU 42 fetches data from the RAM 45, for example, and effects arithmetic processing on the fetched data. Based on the result of its processing, the CPU 42 performs the input/output of signals to and from the outside through the use of the SCI 52 or the like to thereby control various devices.

Since the data processor 41 can be utilized while an operand and the like are being held in the flash memory 1 whose read cycle has been reduced, the speeding up of data processing becomes easy.

While the invention made above by the present inventors has been described specifically by the illustrated embodiments, the present invention is not limited to them. It is needless to say that various changes can be made thereto within the scope not departing from the substance thereof.

For instance, the memory mat configuration of the flash memory cell is not limited to such a NOR type as described above and may take a NAND type or the like. The circuit configuration of the sense amplifier is not limited to the current sense type and the differential amplification type or the like. The specific configuration of the flash memory is not limited to FIG. 2. The circuit module with the data processor being on-chipped is not limited to the above. The non-volatile memory cell may be one which stores multi-valued information of four value or more.

Advantageous effects obtained by typical ones of the inventions disclosed in the present application will be described in brief as follows:

Each of main bit lines is supplied with a clamp voltage from a voltage supply element during at least a period prior to and subsequent to a read operation with respect to a non-volatile memory cell. Accordingly, there is no need to precharge the main bit line from a ground level upon the operation of reading memory information. A read operation time can hence be shortened. Since the non-volatile memory becomes fast in operating speed, the operating speed or throughput of the whole data processing system using it can be improved.

Owing to the stop of supply of the clamp voltage by the voltage supply element during the read operation for the non-volatile memory cell, the operation of sensing by a sense amplifier is made stable even with respect to the small amount of a signal read from the memory cell, and hence the determination of the sense operation can be speeded up.

If a discharge element for discharging each of the sub bit lines when each of the sub bit line selection switch elements is brought to an off state, is adopted, the fear of disturb can be prevented before happens. That is, the precharge of the main bit line, i.e., the supply of the clamp voltage and the discharge of the sub bit line are performed in parallel. Supplying the clamp voltage to the main bit line when the sub bit line selection switch element is held off, avoids mutual interference of the parallel operations.

In order to shorten a precharge time prior to the reading of memory information with a main/sub bit line structure as a premise, the main bit line is clamped to a precharge voltage in advance, and the drain (sub bit line) of each memory cell is maintained at a ground potential. There is therefore no problem of memory disturb. Since the time required to charge each main bit line becomes predominant, the time necessary for precharge can be shortened by clamping the main bit line to the precharge voltage in advance. While both the main bit and sub bit lines have heretofore been discharged and set as the ground potential after reading, only each sub bit line is intended for discharge. Clamping the main bit line to the precharge voltage simultaneously with its discharge makes it possible to shorten the time necessary for charge and discharge.

Since the above means does not depend on the configuration of the sense amplifier, it is adaptable even if sense amplifiers of any circuit configuration are used. It is not necessary to change the sense amplifier.

What is claimed is:

1. A data processor, comprising:

an electrically programmable non-volatile memory; and a CPU accessible to the non-volatile memory, wherein the non-volatile memory includes a plurality of non-volatile memory cells, word lines respectively connected to select terminals of the non-volatile memory cells, sub bit lines respectively connected to data terminals of the non-volatile memory cells, main bit lines, sub bit line selection switch elements which selectively connect the sub bit lines to the main bit lines, a sense amplifier connected to the main bit lines via column switch elements, voltage supply elements each of which supplies a predetermined clamp voltage to each main bit line, and discharge elements which discharge the sub bit lines, wherein each of the voltage supply elements supplies the clamp voltage to the corresponding main bit line before the start and end of a read operation effected on each non-volatile memory cell, and wherein the discharge elements discharge the sub bit lines after the completion of the read operation.

2. The data processor according to claim 1, wherein a timing provided to supply the clamp voltage to each of the main bit lines after the completion of the read operation is set after the sub bit line selection switch element has been brought to an off state.

3. The data processor according to claim 2, wherein a timing provided to discharge each of the sub bit lines after the completion of the read operation is set after the sub bit line selection switch element has been brought to an off state.

* * * * *